(12) United States Patent
Yasui et al.

(10) Patent No.: US 7,908,993 B2
(45) Date of Patent: Mar. 22, 2011

(54) FILM FORMING APPARATUS, FILM FORMING METHOD AND METHOD FOR MANUFACTURING PIEZOELECTRIC ACTUATOR

(75) Inventors: Motohiro Yasui, Nagoya (JP); Jun Akedo, Tsukuba (JP)

(73) Assignees: Brother Kogyo Kabushiki Kaisha, Nagoya-shi, Aichi-ken (JP); National Institute of Advanced Science and Technology, Tokyo (JP)

( * ) Notice: Subject to any disclaimer, the term of this patent is extended or adjusted under 35 U.S.C. 154(b) by 1244 days.

(21) Appl. No.: 11/466,665

(22) Filed: Aug. 23, 2006

(65) Prior Publication Data

US 2007/0044713 A1    Mar. 1, 2007

(30) Foreign Application Priority Data

Aug. 24, 2005    (JP) ................................. 2005-243130

(51) Int. Cl.
    *B05C 15/00*    (2006.01)
(52) U.S. Cl. .......... 118/300; 118/707; 118/50; 118/718; 118/719; 414/217
(58) Field of Classification Search .................. 118/707, 118/50, 718, 719; 414/217
See application file for complete search history.

(56) References Cited

U.S. PATENT DOCUMENTS

| | | | |
|---|---|---|---|
| 5,358,806 A | | 10/1994 | Haraichi et al. |
| 5,364,225 A | * | 11/1994 | Hecht et al. .................... 414/805 |
| 5,439,763 A | | 8/1995 | Shimase et al. |
| 6,390,019 B1 | * | 5/2002 | Grimbergen et al. ...... 118/723 R |
| 6,537,415 B2 | * | 3/2003 | Kojima et al. ............. 156/345.1 |
| 6,755,339 B2 | * | 6/2004 | Lamothe et al. ............. 228/20.1 |
| 6,783,800 B2 | | 8/2004 | Saito et al. |
| 2003/0131902 A1 | * | 7/2003 | Dickinson et al. ................ 141/8 |
| 2003/0198551 A1 | * | 10/2003 | Schmidt et al. ............ 414/749.1 |
| 2004/0227227 A1 | * | 11/2004 | Imanaka et al. .............. 257/700 |

FOREIGN PATENT DOCUMENTS

| | | |
|---|---|---|
| JP | 1992289649 A | 10/1992 |
| JP | 2003306762 A | 10/2003 |

* cited by examiner

*Primary Examiner* — Parviz Hassanzadeh
*Assistant Examiner* — Albert Hilton
(74) *Attorney, Agent, or Firm* — Baker Botts L.L.P.

(57) ABSTRACT

A film forming apparatus including a film forming chamber which forms a film, a jetting mechanism which jets aerosol containing material particles onto a substrate in the film forming chamber, a measuring chamber communicating with the film forming chamber, a measuring mechanism which measures a thickness of the film in the measuring chamber, a pressure adjusting mechanism which controls an internal pressure of the film forming chamber and the measuring chamber, a conveyor which transports the substrate between the film forming chamber and the measuring chamber, and a blocking section which blocks a communication between the film forming chamber and the measuring chamber. Accordingly, inside of the measuring chamber is maintained clean without being polluted with the aerosol, and the measurement precision can be maintained. In the film forming process, the film thickness can be easily and precisely measured, and fed back to the film forming condition.

14 Claims, 13 Drawing Sheets

FILM FORMING APPARATUS, FILM FORMING METHOD AND METHOD FOR MANUFACTURING PIEZOELECTRIC ACTUATOR

CROSS REFERENCE TO RELATED APPLICATION

The present application claims priority from Japanese Patent Application No. 2005-243130, filed on Aug. 24, 2005, the disclosure of which is incorporated herein by reference in its entirety.

BACKGROUND OF THE INVENTION

1. Field of the Invention

The present invention relates to a film forming apparatus and a film forming method, and particularly to formation of piezoelectric film in a piezoelectric actuator used in an ink jet head or the like.

2. Description of the Related Art

A so-called aerosol deposition method (AD method) is known as a method for manufacturing a piezoelectric actuator used in an ink jet head or the like. For example, JP-A-2003-306762 discloses a method for generating aerosol by dispersing fine particles of piezoelectric material into gas in an aerosol chamber, guiding the generated aerosol to a jet nozzle in a film forming chamber by the difference in pressure between the aerosol chamber and the film forming chamber which is caused by reducing the internal pressure of the film forming chamber, thereby jetting the aerosol to the surface of a substrate. According to this method, the fine particles contained in the aerosol collide with and deposit onto the substrate, thereby forming piezoelectric film.

When a thin film is formed, it is difficult to control the thickness of the film perfectly, and particularly, there is a tendency that the variation in the film thickness becomes larger as the film forming speed is increased. Therefore, it has been adopted to control the film thickness as needed by setting an initial condition experientially, measuring the film thickness during film formation and performing parameter control to some degree.

However, as in the case of the AD method, in a case where a method for executing the film forming process in reduced pressure is adopted, and the film thickness is measured during the film formation, there must be taken an extremely complicated procedure in which the internal pressure of the film forming chamber is temporarily returned to normal pressure, a substrate placed in the film forming chamber is taken out to measure the film thickness, the substrate is returned to the inside of the film forming chamber again after the film thickness is measured, and then the internal pressure of the chamber is adjusted.

SUMMARY OF THE INVENTION

The present invention has an object to provide a film forming apparatus and a film forming method that can easily control the film thickness in a film forming process.

According to a first aspect of the present invention, a film forming apparatus is provided including: a film forming chamber which forms a film; a jetting mechanism which jets aerosol containing material particles onto a substrate in the film forming chamber to form a film formed of the material particles on the substrate; a measuring chamber communicating with the film forming chamber; a measuring mechanism which measures a thickness of the film in the measuring chamber; a pressure adjusting mechanism which is connected to the film forming chamber and the measuring chamber and which controls an internal pressure of the film forming chamber and an internal pressure of the measuring chamber; a conveyor which transports the substrate between the film forming chamber and the measuring chamber; and a blocking section which blocks a communication between the film forming chamber and the measuring chamber.

The film forming apparatus according to the present invention may be used to form film of oxide ceramics such as alumina, zirconia, silica, mullite or the like. Particularly, the film forming apparatus may be suitably used to form piezoelectric film for a piezoelectric actuators which is formed of lead titanate zirconate (PZT), lead magnesium niobate (PMN) or the like. The substrate on which the film is formed is not limited to a specific one insofar as it is normally applicable to the film formation by the aerosol deposition method, and for example, stainless steel (SUS430, SUS304 or the like), 42A alloy, alumina, zirconia, titan or the like may be used for the substrate.

In this case, in a state that the internal pressure of the film forming chamber and the internal pressure of the measuring chamber are depressurized, the substrate can be transformed between both chambers and both the film formation and the measurement can be repeated. Furthermore, when the film is formed, the communication between the film forming chamber and the measuring chamber can be broken. Therefore, even when these chambers are used for a long period of time, the inside of the measuring chamber can be prevented from being polluted by adherence of aerosol and thus the inside of the measuring chamber can be maintained clean, so that the measuring precision can be maintained.

In the film forming apparatus of the present invention, the measuring mechanism may be a non-contact type mechanism, and may be arranged at outside of the measuring chamber.

Further, in the film forming apparatus of the present invention, the measuring mechanism may be an optical mechanism which is provided with a light emitting section which emits light to the substrate, and a light receiving section which receives light reflected from the substrate.

According to the above-described construction, the thickness of the film on the substrate in the measuring chamber can be measured by operating the measuring mechanism at the outside of the measuring chamber. Accordingly, it is unnecessary for a worker to return the internal pressure of the measuring chamber to normal pressure in order to enter the measuring chamber every time the thickness of the film is measured. Therefore, the film forming process can be further simplified.

In the film forming apparatus of the present invention, each of the film forming chamber and the measuring chamber may be connected to the pressure adjusting mechanism via a valve. In this case, even when the pressure adjusting mechanism is not provided in each of the film forming chamber and the measuring chamber, the internal pressure of each of the film forming chamber and the measuring chamber can be individually adjusted with only one pressure adjusting mechanism by opening/closing the valve. Therefore, the cost can be reduced.

In the film forming apparatus of the present invention, a port for carrying the substrate in and out may be provided in the measuring chamber. In this case, when the substrate is carried in or carried out, only the internal pressure of the measuring chamber may be merely returned to normal pressure, and the inside of the film forming chamber can be kept at a depressurized state at all times, so that variation of the pressure of the film forming chamber which affects the film formation can be minimized.

In the film forming apparatus of the present invention, the conveyor may be provided as a plurality of conveyors. In this case, for example, at the same time when one substrate is subjected to film formation in the film forming chamber, the film thickness of another substrate is measured in the measurement chamber, and then both the substrates are exchanged with each other through the plurality of conveyors. Thereafter, at the same time when the film thickness of the one substrate is measured in the measurement chamber, the other substrate is subjected to the film formation in the film forming chamber, whereby the film forming processes for the plurality of substrates can be performed at the same time. Accordingly, the production efficiency can be enhanced.

In the film forming apparatus of the present invention, an intermediate chamber may be provided between the film forming chamber and the measuring chamber, through which the film forming chamber and the measuring chamber communicate with each other, and the intermediate chamber may be provided with a cleaner which removes contamination of the substrate. With the above construction, the material particles can be prevented from flowing into the measuring chamber when the substrate is transported, and thus the inside of the measuring chamber can be maintained clean. Accordingly, the measuring precision can be maintained.

In the film forming apparatus of the present invention, the cleaner may be a gas cleaner which removes the contamination of the substrate by spraying gas to the substrate, and the gas cleaner may serve also as a second pressure adjusting mechanism which adjusts a pressure of one of the film forming chamber and the measuring chamber communicating with the intermediate chamber by supplying gas to the intermediate chamber. In this case, the construction of the film forming apparatus can be simplified.

In the film forming apparatus of the present invention, the gas may be same as gas which forms the aerosol. In this case, removal of contaminants and measurement can be performed in an atmosphere approximate to an atmosphere in which the film formation is performed, and thus a newly prepared face occurred owing to crack of fine particles at the film formation time can be maintained in a nearly new state until the film reformation is carried out, so that the film reformation can be excellently performed.

In the film forming apparatus of the present invention, the blocking section may be formed as a plurality of blocking sections provided in the intermediate chamber at two locations on a side of the film forming chamber and a side of the measuring chamber. With this construction, the material particles floating in the film forming chamber can be prevented from flowing into the measuring chamber and polluting the inside of the measuring chamber owing to the difference in internal pressure between the film forming chamber and the measuring chamber.

In the film forming apparatus of the present invention, the cleaner may be arranged in the intermediate chamber between the blocking sections at the two locations. In this case, when the work of removing excessive material particles, or the like, adhering to the substrate is carried out, it can be performed in a state that the blocking sections at two locations are closed. With this construction, the variation of the internal pressure in the intermediate chamber in the removing work and the material particles, or the like, removed from the substrate can be prevented from adversely affecting the film formation and the measurement.

In the film forming apparatus of the present invention, an intermediate chamber-pressure adjusting mechanism, which controls an internal pressure of a space partitioned by the blocking sections at the two locations, may be arranged in the intermediate chamber.

In this case, when the substrate is transported between the film forming chamber and the intermediate chamber, in a state that the blocking section on a side of the measuring chamber is closed, the internal pressure of the intermediate chamber is matched to that of the film forming chamber, and then the blocking section on a side of the film forming chamber is opened, and the substrate is transported. On the other hand, when the substrate is transported between the measuring chamber and the intermediate chamber, in a state that the blocking section on the side of the film forming chamber is closed, the internal pressure of the intermediate chamber is matched to that of the measuring chamber, and then the blocking section on the side of the measuring chamber is opened. As described above, when the substrate is transported, it is necessary only to change the internal pressure of the intermediate chamber which needs only a relatively narrower space than the film forming chamber and the measuring chamber and the internal pressure of which can easily be adjusted.

In the film forming apparatus of the present invention, a pressure controller which controls one of the pressure adjusting mechanism and the valve may be provided such that the internal pressure of the measuring chamber is higher than the internal pressure of the film forming chamber when the substrate is transported by the conveyor.

In the film forming apparatus of the present invention, an opening/closing portion which is provided in the measuring chamber and which opens/closes the port for carrying the substrate in and out, an open/close detector which detects an open/close state of the port by the opening/closing portion, and a blocking controller which closes the blocking section when an open/close detector detects that the port is in an open state, may be provided.

In the film forming apparatus of the present invention, a position detector which is provided in the conveyor and which detects a position of the substrate on the conveyor; and a blocking controller which closes the blocking section on the side of the measuring chamber and opens the blocking section on the side of the film forming chamber when the position detector detects that the substrate is located between the film forming chamber and the intermediate chamber, and which closes the blocking section on the side of the film forming chamber and opens the blocking section on the side of the measuring chamber when the position detector detects that the substrate is located between the measuring chamber and the intermediate chamber, may be provided.

In these cases, the pressure adjustment, or the like, between the film forming chamber and the measuring chamber can be automated when the substrate is carried in/carried out and is transported between the film forming chamber and the measuring charter.

In the film forming apparatus of the present invention, a judging section which judges whether or not the thickness of the film measured by the measuring mechanism is smaller than a predetermined reference thickness; a jet condition adjusting section which adjusts a jet condition of the jetting mechanism on the basis of the thickness of the film measured by the measuring mechanism; and an apparatus controller which controls, the conveyor to transport the substrate from the measuring chamber to the film forming chamber, which controls the jet condition adjusting section to adjust the jet condition of the jetting mechanism in accordance with the thickness of the film and controls the jetting mechanism to jet the aerosol to the substrate transported to the film forming chamber according to the adjusted jet condition when the judging section judges that the film thickness is smaller than the reference thickness, may be provided.

In this case, when the thickness of the film measured by the measuring mechanism is smaller than a reference thickness, the film forming condition (the jet condition of the jetting mechanism) is adjusted in accordance with the measurement result of the thickness of the film, and then the film is reformed. Accordingly, the film formation to compensate for an insufficient thickness of the film can be performed with high precision.

According to the second aspect of the present invention, a method for forming a film of material particles on a substrate by a film forming apparatus having a film forming chamber which forms a film, a jetting mechanism which jets aerosol containing the material particles in the film forming chamber, a measuring chamber communicating with the film forming chamber, a measuring mechanism which measures the thickness of the film formed in the measuring chamber, and a blocking section which blocks a space between the film forming chamber and the measuring chamber is provided, and the method includes: a substrate carrying in step of carrying the substrate in the film forming chamber; a film forming step of forming the film on the substrate by jetting the aerosol from the jetting mechanism in a state that the film forming chamber is blocked from the measuring chamber; a first substrate transporting step of transporting the substrate from the film forming chamber to the measuring chamber in a state that the film forming chamber and the measuring chamber are depressurized; a film thickness measuring step of measuring the thickness of the film; a judging step of judging whether or not the thickness of the film reaches a predetermined reference thickness, on the basis of a measurement result in the film thickness measuring step; and a re-forming step of re-forming the film in case that the thickness of the film is judged to be smaller than the reference thickness in the judging step; and the re-forming step has a second substrate transporting step of transporting the substrate from the measuring chamber to the film forming chamber in a state that an internal pressure of the film forming chamber and an internal pressure of the measuring chamber are reduced, an adjusting step of adjusting a setting of a film forming condition in the film forming step on the basis of a measurement result in the film thickness measuring step, and a step of re-executing the film forming step, the first substrate transporting step, the film thickness measuring step and the judging step.

In this case, inside of the measuring chamber can be prevented from being polluted with aerosol so as to be kept clean and the measuring precision is maintained. Furthermore, the thickness of the film is easily and precisely measured during the film forming process, and can be fed back to the film forming condition. Accordingly, a film having uniform thickness can be manufactured easily. In the present invention, the adjusting step may be set before or after the second substrate transporting step.

In the film forming method for the present invention, after the judging step, a substrate carrying out step of carrying the substrate out the measuring chamber may be included, in place of the re-forming step when a judgment is made in the judging step that the thickness of the film is not less than the reference thickness. By doing this, when it is unnecessary to carry out film formation again like a case where a film having a desired film thickness has been formed or a case where a film having a thickness larger than a desired thickness has been formed and thus it is difficult to restore the film, the process can be shifted to the steps after the film formation without carrying out any extra step. Accordingly, the film formation can be rapidly performed.

In the film forming method of the present invention, the internal pressure of the measuring chamber may be set to be higher than the internal pressure of the film forming chamber in the first substrate transporting step and the second substrate transporting step. By doing this, the material particles floating in the film forming chamber can be prevented from flowing into the measuring chamber and polluting inside of the measuring chamber. Accordingly, the inside of the measuring chamber can be kept clean, and the measuring precision can be maintained.

In the film forming method of the present invention, the measuring chamber may be provided with a port for carrying the substrate in and out the apparatus; and in the substrate carrying in step, the substrate may be carried in from the port for carrying the substrate in and out in a state that the film forming chamber is blocked off from the measuring chamber, and further the substrate may be transported from the measuring chamber to the film forming chamber. In this case, the substrate can be carried in from outside into the apparatus in a state that the film forming chamber is kept depressurized. Accordingly, the process can be immediately shifted to the subsequent film forming step, and the film formation can be rapidly performed.

In the film forming method of the present invention, an intermediate chamber, through which the film forming chamber and the measuring chamber communicate with each other, may be provided between the film forming chamber and the measuring chamber, and blocking sections may be provided in the intermediate chamber at two locations on a side of the film forming chamber and on a side of the measuring chamber; and, after the substrate carrying in step, in the first substrate transporting step and the second substrate transporting step, the blocking section on the side of the film forming chamber may be opened in a state that the blocking section on the side of the measuring chamber is closed when the substrate is transported between the film forming chamber and the intermediate chamber, and the blocking section on the side of the measuring chamber may be opened in a state that the blocking section on the side of the film forming chamber is closed when the substrate is transported between the measuring chamber and the intermediate chamber. By doing this, the material particles floating in the film forming chamber can be prevented from flowing into the measuring chamber and polluting inside of the measuring chamber owing to the difference in internal pressure between the film forming chamber and the measuring chamber.

According to the third aspect of the present invention, a method of producing piezoelectric actuator for forming piezoelectric film of piezoelectric material particles on a substrate is provided by a film forming apparatus having a film forming chamber which forms a film, a jetting mechanism which jets aerosol containing the piezoelectric material particles in the film forming chamber, a measuring chamber communicating with the film forming chamber, a measuring mechanism which measures a thickness of the film formed in the measuring chamber, and a blocking section which blocks a space between the film forming chamber and the measuring chamber, and the method includes: a substrate carrying in step of carrying the substrate in the film forming chamber; a piezoelectric film forming step of forming the piezoelectric film on the substrate by jetting the aerosol from the jetting mechanism in a state that the film forming chamber is blocked from the measuring chamber; a first substrate transporting step of transporting the substrate from the film forming chamber to the measuring chamber in a state that the film forming chamber and the measuring chamber are depressurized; a film thickness measuring step of measuring the thickness of the film; a judging step of judging whether or not the thickness of the film reaches a predetermined reference thickness, on the basis of a measurement result in the film thickness measuring step; a re-forming step of re-forming the film in case that the thickness of the film is judged to be smaller than the reference thickness in the judging step; a substrate carrying out step of carrying the substrate out the measuring chamber in case that the thickness of the film is judged to be not less than the reference thickness in the judging step; and the re-forming step has a second substrate transporting step for transporting the substrate from the measuring chamber to the film forming chamber in a state that an internal pressure of the film forming chamber and an internal pressure of the measuring chamber are reduced; an adjusting step of adjusting a setting of a film forming condition in the film forming step on the basis of the measurement result in the film thickness measuring step; and a step of re-executing the film forming step, the first substrate transporting step, the film thickness measuring step and the judging step.

According to this method, inside of the measuring chamber can be prevented from being polluted with aerosol so as to be kept clean, and the measuring precision can be maintained. Furthermore, the thickness of the piezoelectric film is simply and precisely measured during the film forming process and can be fed back to the film forming condition. Accordingly, a piezoelectric actuator having piezoelectric film which has uniform thickness of the film and an excellent piezoelectric characteristic can be manufactured easily. In the present invention, the adjusting step may be provided before or after the second substrate transporting step.

DETAILED DESCRIPTION OF THE PREFERRED EMBODIMENTS

First Embodiment

Figure 1:
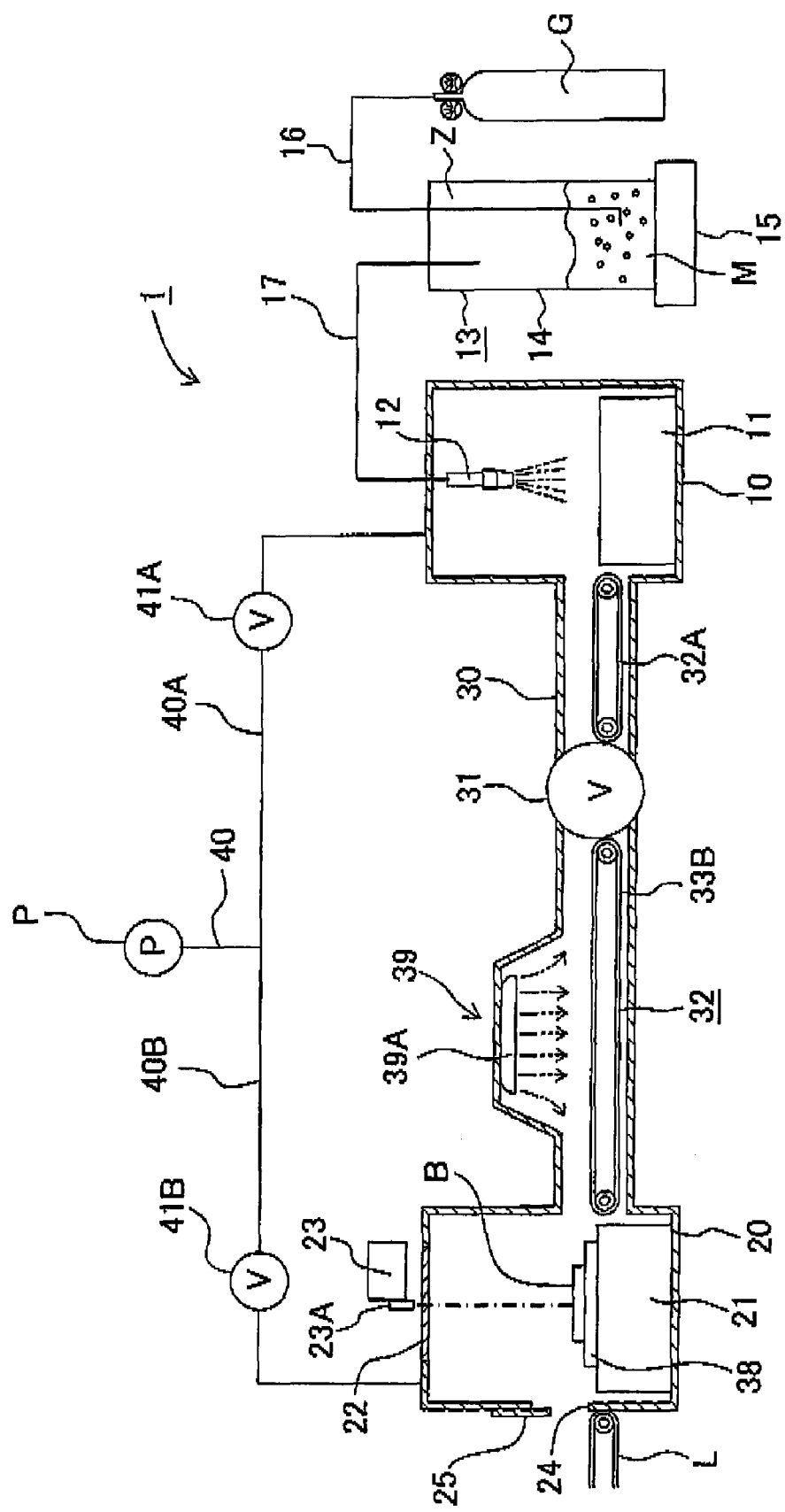
FIG. 1 is a schematic diagram showing a film forming apparatus according to a first embodiment.
Figure 2:
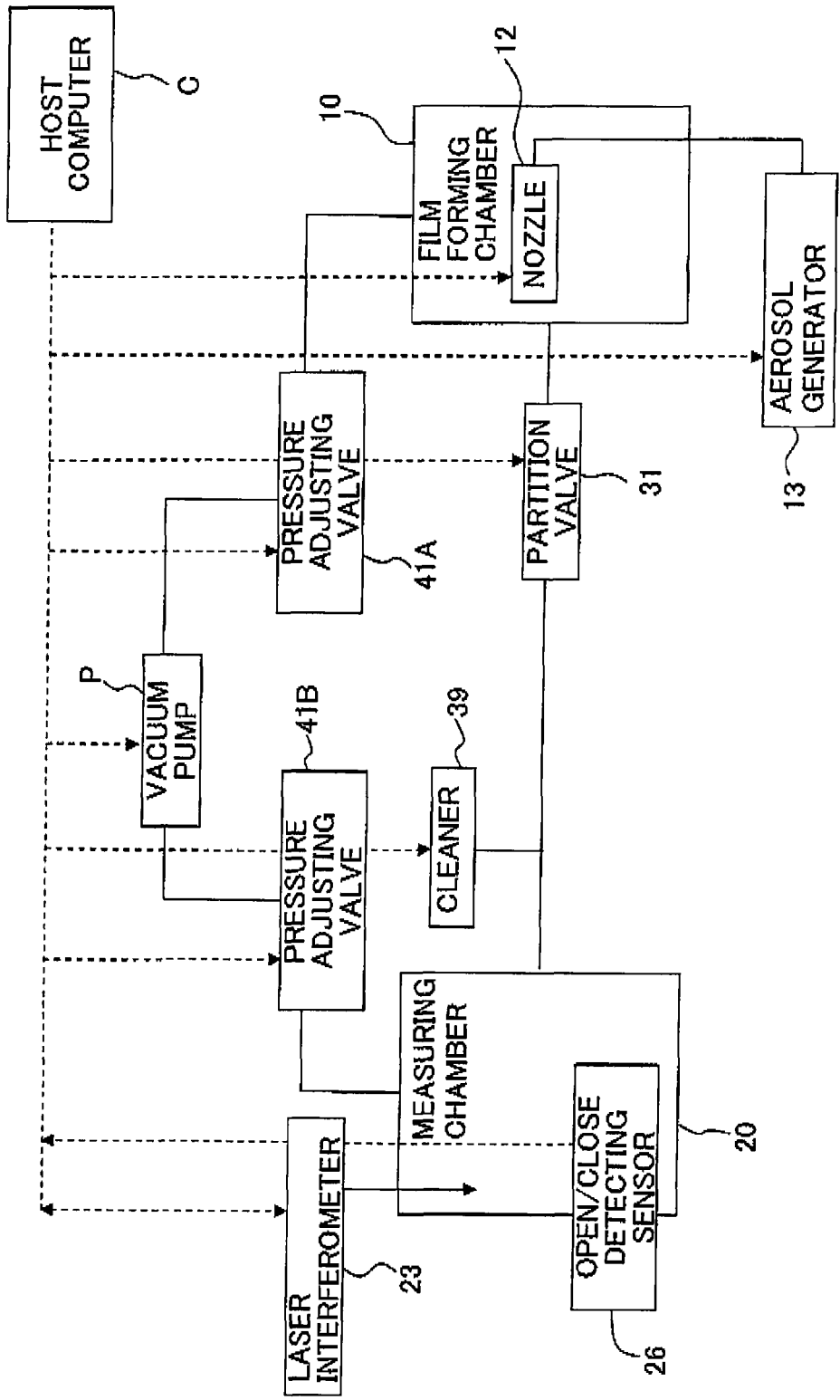
FIG. 2 is a block diagram showing the construction of a film forming apparatus according to the first embodiment.

A first embodiment according to the present invention will be described in detail with reference to FIGS. 1 to 7. FIG. 1 is a schematic diagram showing the overall construction of a film forming apparatus 1 of the present invention, and FIG. 2 is a block diagram showing the film forming apparatus 1. The film forming apparatus 1 includes a film forming chamber 10 in which films are formed, a measuring chamber 20 in which thickness of the formed film is measured, an intermediate chamber 30 that is provided between the film forming chamber 10 and the measuring chamber 20 so as to communicate with both of the chambers 10, 20 and a host computer C (a pressure controller, an blocking controller and an apparatus controller) to automatically control the operation of the film forming apparatus 1.

In the film forming chamber 10, aerosol Z is sprayed onto a substrate B so that material particles M contained in the aerosol z adhere to the substrate B, thereby forming thin film of the material particles M on the substrate B. A stage 11 for mounting the substrate B thereon is arranged in the film forming chamber 10. Furthermore, a jet nozzle 12 for jetting aerosol Z is arranged at the upper side of the stage 11 so that a nozzle hole of the jet nozzle faces a side of the stage 11. The jet nozzle 12 is movable relatively to the stage 11 by a traverse mechanism (not shown), and the jet nozzle 12 can scan a desired route above the substrate B mounted on the stage 11, whereby the jet nozzle 12 can jet aerosol Z to a desired position on the substrate B.

The jet nozzle 12 is connected to an aerosol generator 13. The aerosol generator 13 is provided with an aerosol chamber 14 in which the material particles M can be accommodated, and a vibrating device 15 that is secured to the aerosol chamber 14 and vibrates the aerosol chamber 14. A gas cylinder G for introducing carrier gas is connected to the aerosol chamber 14 via an introducing pipe 16. The tip of the introducing pipe 16 is located in the vicinity of the bottom surface in the aerosol chamber 14, and embedded in the material particles M. As the carrier gas inert gas such as helium, argon, nitrogen or the like, air, oxygen or the like may be used.

The aerosol chamber 14 is connected to the jet nozzle 12 via an aerosol supplying pipe 17, and aerosol Z generated in the aerosol chamber 14 is passed through the aerosol supplying pipe 17 and jetted from the jet nozzle 12. The jet nozzle 12, the aerosol generator 13, the gas cylinder G, the traverse mechanism, or the like, as described above, and a vacuum pump P for generating a difference in pressure between a film forming chamber 10 described later and the aerosol chamber 14 correspond to a jetting mechanism in the present invention.

The measuring chamber 20 is provided to measure the unevenness in the thickness of the film formed on the substrate 10B in the film forming chamber 10, and it is connected to the film forming chamber 10 via an intermediate chamber 30 described later. A measuring table 21 on which the substrate B is mounted is arranged in the measuring chamber 20. Furthermore, a window portion 22 is provided in the ceiling portion of the measuring chamber 20, and a laser interferometer 23 as an optical measuring mechanism is arranged at the upper portion of the window portion 22. A light transmissible glass plate is fitted in the window portion 22, and light emitted from the laser interferometer 23 and light reflected from the substrate B are transmissible through the transmissible glass plate. Accordingly, the thickness of the film formed on the substrate B is measured by the laser interferometer 23 arranged at outside of the measuring chamber 20.

A slender intermediate chamber 30 having a square piped shape through which the film forming chamber 10 and the measuring charter 20 are connected to each other is provided between both chambers. A partition valve 31 (blocking section) is provided in the intermediate chamber 30, and the communication between the film forming chamber 10 and the measuring chamber 20 is allowed or blocked by opening/closing the partition valve 31. Between a stage 11 arranged in the film forming chamber 10 and a measuring table 21 arranged in the measuring chamber 20, a belt conveyor 32 (conveyor) is provided to pass the substrate B through the intermediate chamber 30 and transport the substrate B between the stage 11 and the measuring table 21.

Figure 3:
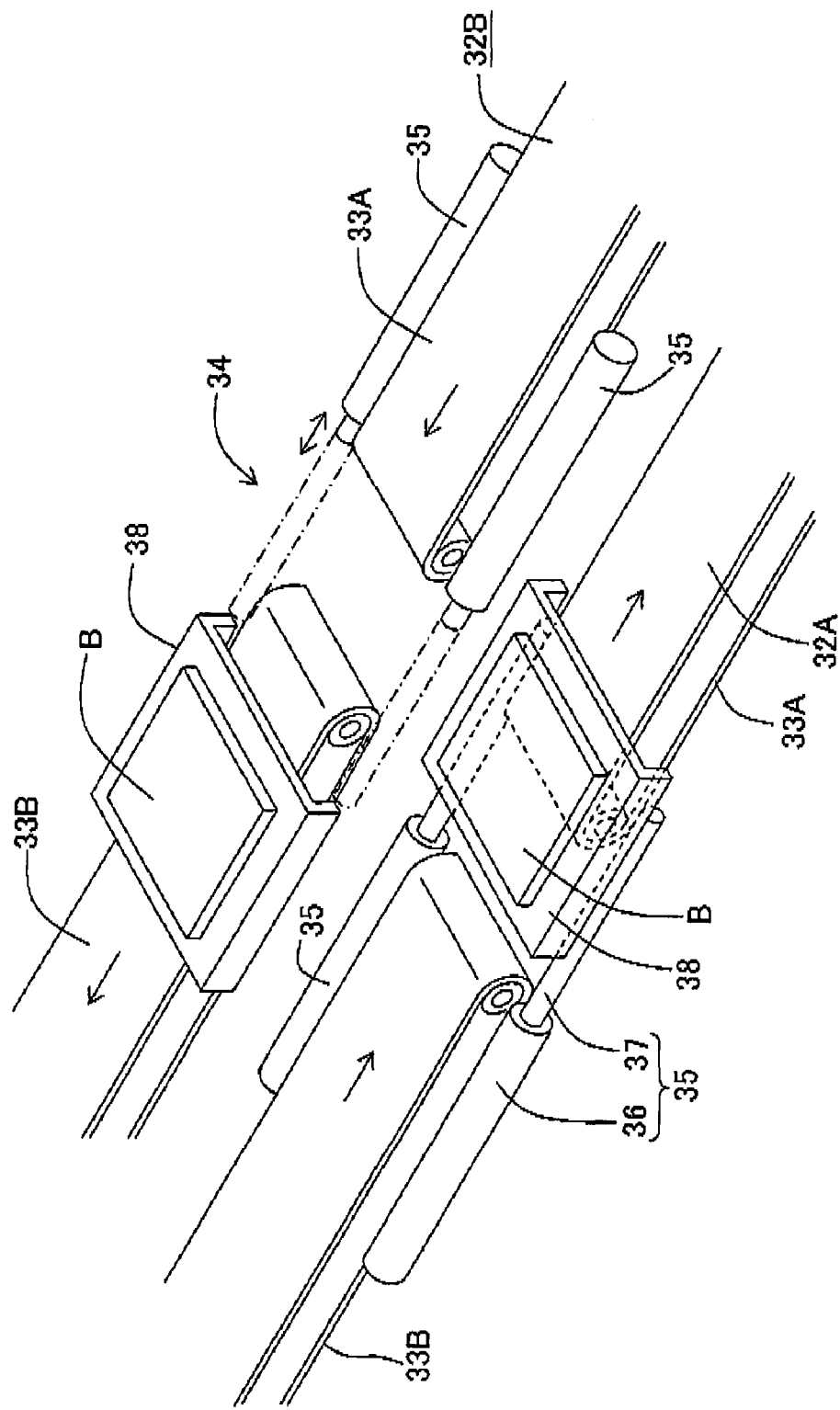
FIG. 3 is a partially enlarged view showing a belt conveyor.

With respect to the belt conveyor 32, two lines of an upward belt conveyor for transporting the substrate B from a side of the measuring chamber 20 (the upper left side of FIG. 3) to a side of the film forming chamber 10 (the lower right side of FIG. 3), and a downward belt conveyor 32B for transporting the substrate B from a side of the film forming chamber 10 side to a side of the measuring chamber 20 are provided parallel to each other as shown in FIG. 3, whereby two substrates can be exchanged with each other all at once between the film forming chamber 10 and the measuring chamber 20. Accordingly, the film forming processes of the two substrates B can be formed at the same time, for example, by forming a film of one substrate B in the film forming chamber 10 while measuring a thickness of the film of the other substrate B in the measuring chamber 20, exchanging both substrates at the same time by the belt conveyors 32A and 32B of two lines, and forming the film of the other substrate B in the film forming chamber 10 while measuring a thickness of the film of the one substrate B in the measuring chamber 20, so as to enhance the production efficiency.

Furthermore, the belt conveyors 32A, 32B of two lines are divided into a conveyor 33A on a side of the film forming chamber and a conveyor 33B on a side of measuring chamber by the partition valve 31 as a boundary therebetween, and when the partition valve 31 is closed, the valve plate (not shown) of the partition valve 31 is entered into the gap between both conveyors 33A and 33B. Accordingly, when the partition valve 31 is closed, the partition valve 31 does not interfere with the belt conveyor 32, thereby ensuring the blocking between both chambers.

Between the conveyor 33A on the side of the film forming chamber and the conveyor 33B on the side of the measuring chamber, a delivery mechanism 34 for delivering the substrate B between both conveyors 33A and 33B is provided. The delivery mechanism 34 includes a pair of cylinder portions 35 in the vicinity of an end portion of the upstream-side conveyors out of the conveyors 33A and 33B in the travel direction (the conveyor 33B on the side of the measuring chamber in the upward belt conveyor 32A and the conveyor 33A on the side of the film forming chamber in the downward belt conveyor 32B), the end portion concerned facing the other-side conveyor 33A, 33B. The cylinder portion 35 is provided with a cylinder tube 36, a piston rod 37 that is accommodated in the cylinder tube 36 and projects to the other-side conveyors 33A and 33B, and the piston rod 37 is driven by a well-known method based on oil pressure or air pressure or the like.

The substrate B is transported mounted on the working table 38 which is formed to be slightly wider than the belt width of the belt conveyor 32. When the substrate B is delivered between both conveyors 33A and 33B, both the side edge portions of the working table 38, that is, the portions overhanging sideward from the belt of the belt conveyor 32 are supported from the lower surface side by the piston rod 37 of the cylinder portion 35. In this state, when the piston rod 37 is driven to the other-side conveyors 33A and 33B, the working table 38 supported by the piston rod 37 is delivered between both conveyors 33A and 33B.

In the intermediate chamber 30, a cleaner 39 (a cleaner and a second pressure adjusting mechanism) for removing dust from the substrate B is provided approximate to the measuring chamber 20 than the partition valve 31. This cleaner 39 is an air blow type cleaner, and purge gas is sprayed from the spray nozzle 39A provided at the upper side of the belt conveyor 32 onto the substrate B transported by the belt conveyor 32. This purge gas is same gas as the carrier gas forming the aerosol Z, and it brushes off excess material particles M adhering to the substrate B during film formation.

The film forming chamber 10 and the measuring chamber 20 are, respectively, connected to a vacuum pump P via an exhaust pipe 40. One end portion of the exhaust pipe 40 is connected to the vacuum pump P (pressure adjusting mechanism), and the other end portion thereof is forked and connected to the film forming chamber 10 and the measuring chamber 20, respectively. The forked branch pipe portions 40A and 40B are provided with pressure adjusting valves 41A and 41B (valves) respectively. By controlling the opening/closing operation of the pressure adjusting valves 41A and 41B and the partition valve 31 provided in the intermediate chamber 30, the internal pressure of each of the film forming chamber 10 and the measuring chamber 20 can be individually adjusted by one vacuum pump P.

The measuring chamber 20 is provided with a port 24 for carrying the substrate B in and out, and the substrate B is carried in and carried out the film forming apparatus 1 from the side of the measuring chamber 20. A door portion 25 is provided in the port 24, and the port 24 can be closed as occasion demands. The port 24 is provided with an opening/closing detecting sensor 26 (opening/closing detector) for detecting the opening/closing state of the port 24 by the door portion 25. The information on the opening/closing state of the port 24 which is achieved by the opening/closing detecting sensor 26 is transmitted to a host computer C, and the host computer C controls the partition valve 31 so that the partition valve 31 is closed at all times when the port 24 is open. Accordingly, when the inside of the measuring chamber 20 is in normal pressure, the communication between the measuring chamber 20 and the film forming chamber 10 is blocked, and thus the inside of the film forming chamber 10 is kept depressurized at all times. The jetting speed of the aerosol Z is determined by the difference in pressure between the depressurized film forming chamber 10 and the pressurized aerosol chamber 14, and thus by reducing the pressure variation in the film forming chamber 10 as much as possible, the efficiency of the film forming process is increased, and unintentional variation of the film forming condition is restrained.

Next, a procedure for forming a film by using the film forming apparatus constructed as described above will be described with reference to film forming step diagrams of FIGS. 4 to 6 and a flowchart of FIG. 7. The operation of the film forming apparatus as described below is automatically controlled by a program stored in the host computer C.

Figure 4A:
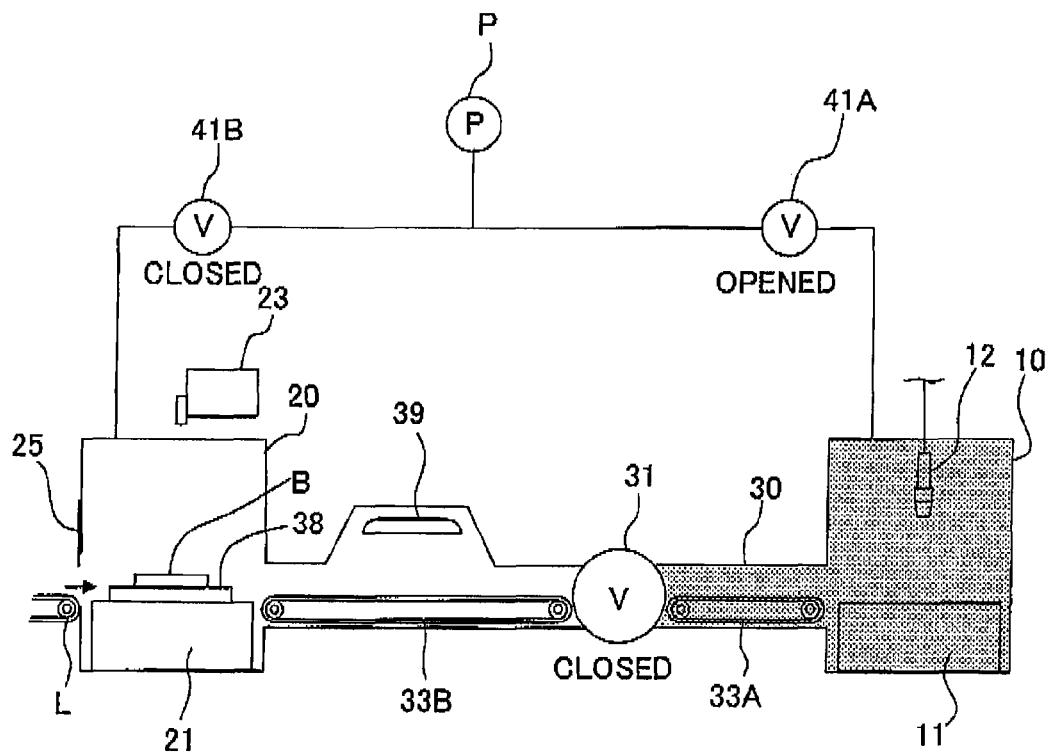
FIG. 4A is a diagram showing an aspect that a substrate is carried in the film forming apparatus in a film forming step of the first embodiment.

As shown in FIG. 4A, the vacuum pump P is started in the state that the pressure adjusting valve 41A on the side of the film forming chamber is opened and the pressure adjusting valve 41B on the side of the measuring chamber and the partition valve 31 are closed, whereby the internal pressure of the film forming chamber 10 is reduced until it is substantially set to the vacuum state.

Subsequently, when the substrate B is transported to the port 24 of the measuring chamber 20 by an external feeding line L, the port 24 is opened. Then, the substrate B is carried in from the port 24 in the open state into the measuring chamber 20. At this time, the opening/closing detecting sensor 26 detects that the port 24 is open, and transmits this information to the host computer C. On the basis of this information, the host computer C controls the partition valve 31 so as not to be opened while the port 24 is open, and the film forming chamber 10 is kept depressurized.

After carrying in the substrate B, the port 24 is closed by the door portion 25. Then, the pressure adjusting valve 41B on the side of the measuring chamber side is opened, and the inside of the measuring chamber 20 is reduced until the internal pressure thereof is substantially equal to a vacuum. After the internal pressure of the measuring chamber 20 is reduced, the pressure adjusting valve 413 is closed.

Figure 4B:
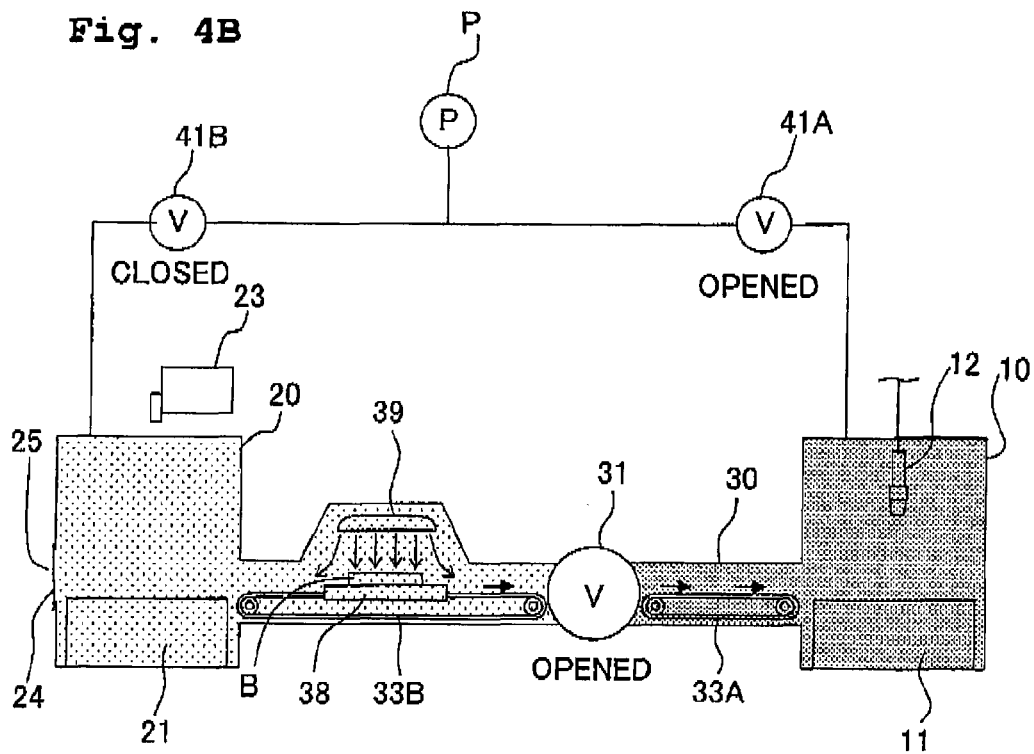
FIG. 4B is a diagram showing an aspect that the substrate is transported from a measuring chamber to the film forming chamber in the film forming step of the first embodiment.

Subsequently, the cleaner 39 is switched on to supply purge gas into the intermediate chamber 30. In this state, as shown in FIG. 4B, the partition valve 31 is opened, and the belt conveyor 32 is driven to transport the substrate B into the film forming chamber 10. The step of transporting the substrate B carried in from the port 24 of the measuring chamber 20 to the film forming chamber 10 is referred to as a substrate carrying in step (S1). At this time, the pressure adjusting valve 41A is opened at the side of the film forming chamber 10, and the gas supplied from the cleaner 39 is exhausted by the vacuum pump P. However, at the side of the measuring chamber 20, the pressure adjusting valve 41B is not opened, and thus no exhaust is carried out. Accordingly, the internal pressure of the measuring chamber 20 is higher than the internal pressure of the film forming chamber 10, and also the flow of atmospheric air in the film forming apparatus 1 always flows from the side of the measuring chamber 20 to the side of the film forming chamber 10, whereby the aerosol and the material particles M in the film forming chamber 10 are prevented from flowing into the measuring chamber 20.

As a film is formed in the film forming chamber 10 is by spraying aerosol Z onto the substrate B so that the material particles contained in the aerosol Z adhere to the substrate B, inside of the film forming chamber 10 may be remarkably contaminated because of the floats of the remaining aerosol Z and the material particles M adhering to the inner wall portion. Therefore, in order to prevent the dust from flowing into the measuring chamber 20 and polluting the inside of the measuring chamber 20 and keep the inside of the measuring chamber 20 clean, the internal pressure of the measuring chamber 20 is set to be higher than the internal pressure of the film forming chamber 10, whereby the measuring precision can be maintained.

The substrate B transported into the film forming chamber 10 is set onto the stage 11. After transporting of the substrate B is finished, the partition valve 31 is closed, and the cleaner 39 is switched off. Furthermore, the internal pressure of the measuring chamber 20 is set to be high during the transporting operation of the substrate B. Therefore, the pressure adjusting valve 41B on the side of the measuring chamber is opened, and the internal pressure of the measuring chamber 20 is reduced to a pressure substantially equal to the internal pressure of the film forming chamber 10. After the adjustment, the pressure adjusting valve 41B is closed.

Figure 5A:
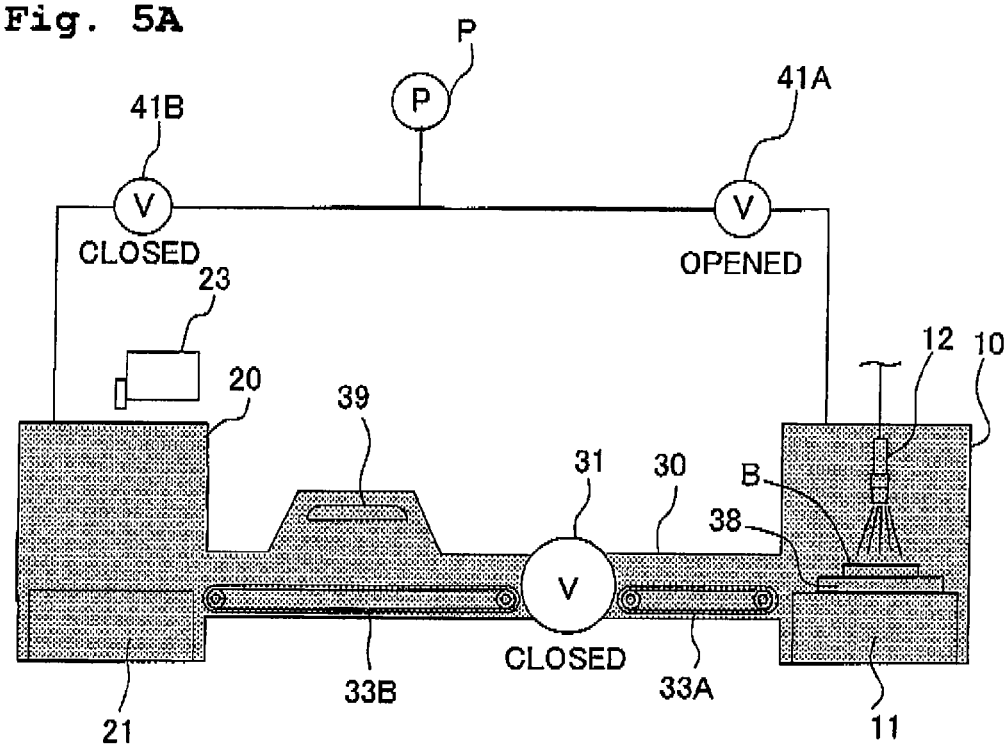
FIG. 5A is a diagram showing an aspect that a film is formed in the film forming chamber in the film forming step of the first embodiment.

Subsequently, a film is formed as shown in FIG. 5A. First, the material particles M are poured into the aerosol chamber 14. Then, the carrier gas is introduced from the gas cylinder G, and the material particles M are stirred up by the gas pressure of the carrier gas. In addition, the aerosol chamber 14 is vibrated by the vibrating device 15 to mix the material particles M and the carrier gas, thereby generating the aerosol Z. The aerosol Z in the aerosol chamber 14 is accelerated at high speed by the difference in pressure between the aerosol chamber 14 and the film forming chamber 10, thereby jetting the aerosol Z from the jet nozzle 12. The material particles M contained in the jetted aerosol Z collide against the substrate B and deposit thereon, thereby forming the film (the film forming step or the piezoelectric film forming step: S2).

Figure 5B:
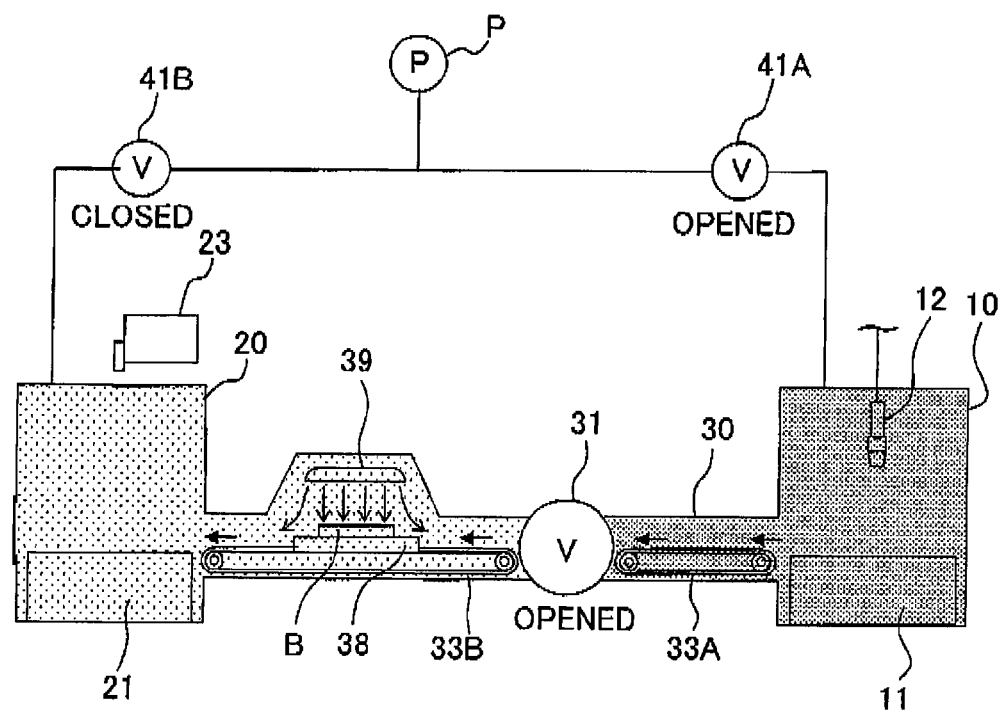
FIG. 5B is a diagram showing an aspect that the substrate is transported from the film forming chamber to the measuring chamber in the film forming step of the first embodiment.

After the film is formed, as shown in FIG. 5B, the substrate B is transported from the film forming chamber 10 to the measuring chamber 20 (first substrate moving step: S3). First, the cleaner 39 is switched on to supply purge gas into the intermediate chamber 30. In this state, the partition valve 31 is opened, and the belt conveyor 32 is driven to transport the substrate B to the measuring chamber 20. Then, when the substrate B passes over the lower side of the cleaner 39, the purge gas supplied from the cleaner 39 is sprayed onto the substrate B to clean the substrate B. Accordingly, the excess material particles M are prevented from adhering to the substrate B, being transported to the measuring chamber 20 and then polluting the inside of the measuring chamber 20.

Furthermore, as in the case of the substrate carrying in step S1 described above, at the side of the film forming chamber 10, the pressure adjusting valve 41A is opened, and the gas supplied from the cleaner 39 is exhausted by the vacuum pump P. However, at the side of the measuring chamber 20, the pressure adjusting valve 41B is not opened, and thus no exhaust is carried out. Accordingly, the internal pressure of the measuring chamber 20 is higher than the internal pressure of the film forming chamber 10, and also the flow of the atmospheric air in the film forming apparatus 1 always flows from the side of the measuring chamber 20 to the side of the film forming chamber 10. Accordingly, the aerosol and the material particles M in the film forming chamber 10 are prevented from flowing into the measuring chamber 20.

Furthermore, at this time, the intermediate chamber 30 and the measuring chamber 20 are filled with the purge gas, and since the purge gas is same gas as the carrier gas forming the aerosol Z, the intermediate chamber 30 and the measuring chamber 20 are set to an atmosphere approximate to that of the film forming chamber 10 at the time when the film is formed. Accordingly, the transportation of the substrate B between the film forming chamber 10 and the measuring chamber 20 and the film measurement in the measuring chamber 20 described later can be performed in an atmosphere which is approximate to the atmosphere in which the film is formed. As described later, when the film forming step S2 is executed again, the film can be excellently formed again. That is, in the film forming step S2, cracks occur in the material particles M colliding against the substrate B, and a newly prepared face having high adhesion is exposed. However, the process to re-form the film can be executed in an atmosphere approximate to that in the film forming chamber 10, so that the exposed newly prepared face can be maintained in a just newly prepared state.

Furthermore, in the film forming apparatus 1 of this embodiment, the two lines of belt conveyors 32 are arranged. Accordingly, a substrate (not shown) to be treated next may be carried in the measuring chamber 20 in advance and then transported from the measuring chamber 20 to the film forming chamber 10 simultaneously with the transportation of the substrate B from the film forming chamber 10 to the measuring chamber 20 (see FIG. 3 in combination). In this case, the film formation of the next substrate can be carried out while thickness distribution of the film formed on the previous substrate B is measured in the next film thickness measuring step. Accordingly, the two substrates can be treated at the same time, and the manufacturing process can be shortened.

The substrate B transported to the measuring chamber 20 is set onto the measuring table 21. After transporting of the substrate B is finished, the partition valve 31 is closed, and also the cleaner 39 is switched off. Furthermore, the internal pressure of the measuring chamber 20 is increased in the first substrate transporting step 53, and thus the internal pressure of the measuring chamber 20 is adjusted to be substantially equal to the internal pressure of the film forming chamber 10 by opening the pressure adjusting valve 41B at the side of the measuring chamber.

Figure 6:
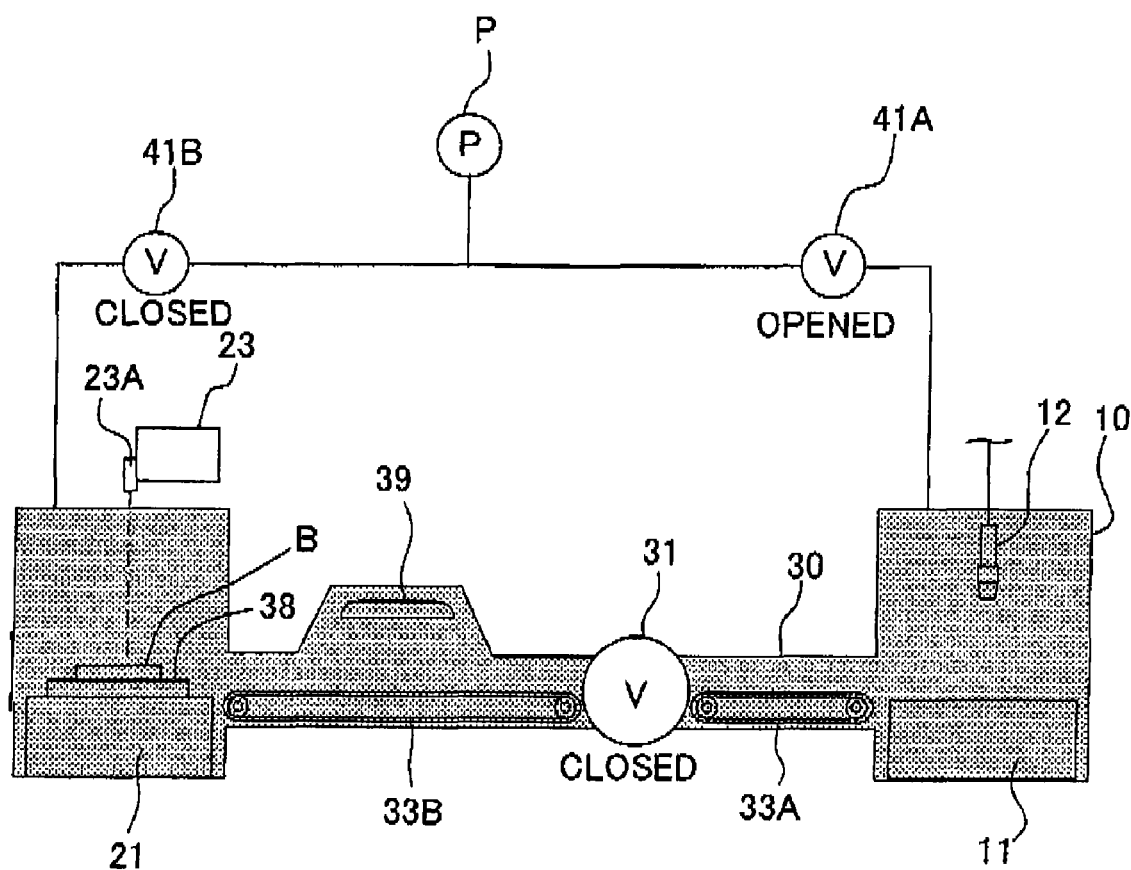
FIG. 6 is a diagram showing an aspect that thickness of the film is measured in the measuring chamber in the film forming step of the first embodiment.
Figure 7:
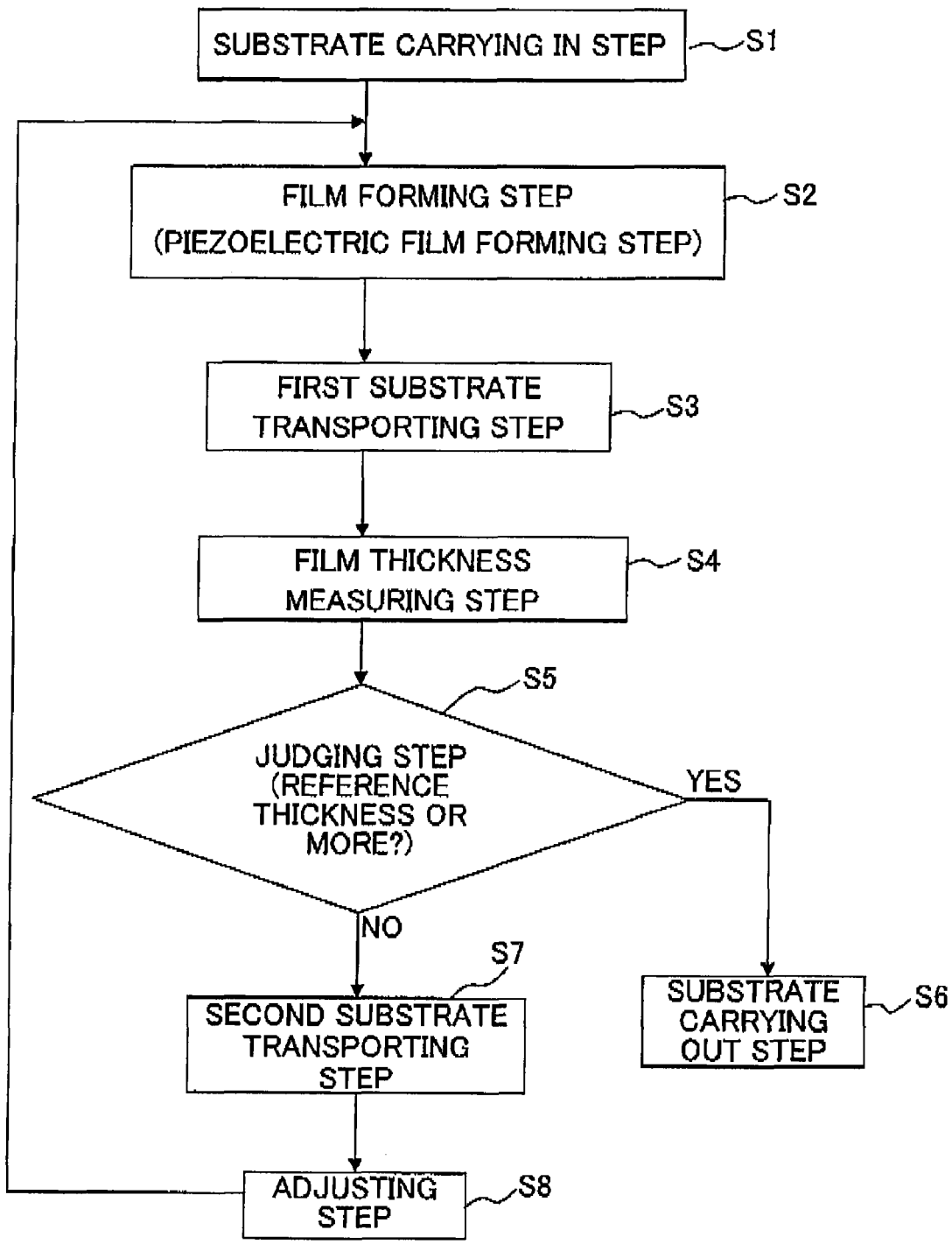
FIG. 7 is a flowchart showing the flow of the film formation in the first embodiment and a second embodiment.

Subsequently, thickness distribution of the film formed in the film forming step is measured as shown in FIG. 6 (film thickness measuring step: S4). When the laser interferometer 23 is actuated, light emitted from the light source (not shown) provided to a light emitting and receiving portion 23A (a light emitting portion and a light receiving portion) is transmitted through a light transmissible glass plate fitted in the window portion 22 of the measuring chamber 20, and reaches the surface of the substrate B transported into the measuring chamber 20. The light reaching the substrate B is reflected by the film formed on the substrate B, transmitted through the glass plate fitted in the window portion 22 of the measuring chamber 20 again, and then received by a CCD camera (not shown) provided to the light emitting and receiving portion 23A.

As described above, the laser interferometer 23 serving as a non-contact type optical mechanism is used as the measuring mechanism, and the laser interferometer 23 is arranged at outside of the measuring chamber 20. Furthermore, the window portion 22 in which a light-transmissible glass plate is fitted is provided in the ceiling portion of the measuring chamber 20, and the light emitted from the laser interferometer 23 can be irradiated from the window portion 22 into the measuring chamber 20. Accordingly, the thickness of the film on the substrate B in the measuring chamber 20 can be measured by operating the laser interferometer 23 from outside of the measuring chamber 20. Accordingly, it is unnecessary to open/close the measuring chamber 20 for the adjustment of the measuring condition and the maintenance of the laser interferometer 23, or the like, and the laser interferometer 23 can be operated while the internal pressure of the measuring chamber is maintained to be reduced.

The film formation and the measurement are carried out in different chambers, and thus the communication between the film forming chamber 10 and the measuring chamber 20 can be blocked when the film is formed. In addition, the cleaner 39 is provided between the film forming chamber 10 and the measuring chamber 20, and also the substrate B transported from the film forming chamber 10 is transported into the measuring chamber 20 in the state that the substrate B is cleaned. Accordingly, the inside of the measuring chamber 20 can be prevented from being polluted with the aerosol Z and the measuring precision can be maintained. The data of the reflected light received by the CCD camera is transmitted to the host computer C and the surface state of the film is analyzed.

When the substrate to be next treated is transported to the film forming chamber 10 in the previous first substrate transporting step S3, a film is formed on the substrate transported into the film forming chamber 10 while the film thickness measuring step S4 is being executed.

After the measurement is finished, the host computer C (judging section) judges on the basis of the transmitted data whether a film having a predetermined reference thickness is formed or not (judging step: S5). If it is judged that the film has the reference thickness or if the film has a thickness larger than the reference thickness, the film formation is finished, and the port 24 is opened and the substrate B is carried out the measuring chamber 20 in the state that the partition valve 31 is closed (substrate carrying out step: S6). At this time, the inside of the measuring chamber 20 is returned to a normal pressure state whose pressure is equal to the outside pressure, however, the inside of the film forming chamber 10 is kept depressurized because the partition valve 31 is closed. Furthermore, as in the case of the carrying operation of the substrate B into the measuring chamber 20, the opening/closing detecting sensor 26 detects the open state of the port 24, and transmits this information to the host computer C. On the basis of this information, the host computer C controls the partition valve 31 so as not to be opened while the port 24 is opened.

As described above, the port 24 of the substrate B is provided in the measuring chamber 20, and the communication between the measuring chamber 20 and the film forming chamber 10 is closed by the partition valve 31. Therefore, only the internal pressure of the measuring chamber 20 may be returned to normal pressure when the substrate B is carried out, and the variation of the film forming condition can be minimized. At this time, a new substrate (not shown) may be carried in simultaneously with the carrying out the substrate B for which the film formation has been finished, and subsequently a film may be formed on the new substrate. The substrate B judged that the film formed thereon has the reference thickness in the judging step S5 is treated as a normal completed article after the substrate carrying out step S6. On the other hand, the substrate B judged that the film formed thereon has a thickness larger than the reference thickness is treated as a defective substrate which fails in film formation.

On the other hand, if it is judged that the film thickness is less than the reference thickness, the substrate B is transported to the film forming chamber 10 again (second substrate moving step; S7). That is, as in the case of the substrate carrying in step S1 described above, the cleaner 39 is switched on to supply purge gas into the intermediate chamber 30. In this state, the partition valve 31 is opened, and the belt conveyor 32 is driven to transport the substrate B into the film forming chamber 10 (FIG. 4B). At this time, as in the case of the substrate carrying in step S1 and the first substrate transporting step S3, the internal pressure of the measuring chamber 20 is set to be higher than the internal pressure of the film forming chamber 10 by purge gas supplied from the cleaner 39, whereby the inside of the measuring chamber 20 is prevented from being polluted.

When the film formation is carried out on the next substrate in the film forming chamber 10 simultaneously with the film thickness measurement of the previous substrate, the substrate B after the film formation is finished is transported to the measuring chamber 20.

After transporting of the substrate B is finished, the partition valve 31 is closed, and the cleaner 39 is switched off. The substrate B transported into the film forming chamber 10 is set onto the stage 11.

When the substrate B is set onto the stage, the host computer C (jetting condition adjusting section) adjusts the film forming condition according to the analysis result in the previous film thickness measuring step S4 (adjusting step; S8). For example, the scan route of the jet nozzle 12 and the jet condition (film forming condition) such as the jet amount of the aerosol Z, or the like, are adjusted so that material particles M adhere to an area having a small film thickness so as to have a large thickness. Thereafter, the film forming step S2 is executed again according to the adjusted film forming condition (FIG. 5C), whereby the variation in the film thickness in the first film forming step S2 can be overcome.

When the film formation is finished, the substrate B is transported to the measuring chamber 20 again (FIG. 5B), and the thickness of the film is measured (FIG. 6). As described above, the substrate B is reciprocated between the film forming chamber 10 and the measuring chamber 20 to repeat the film formation and the measurement until the thickness of the film reaches a desired thickness.

When a piezoelectric actuator is manufactured by particles of piezoelectric material as the material particles M by using the film forming apparatus 1 of this embodiment, the substrate B may be formed of metal so that the substrate B is used as one electrode, for example, and another electrode may be formed on the piezoelectric film formed of the particles of the piezoelectric material. With this construction, there can easily be manufactured a piezoelectric actuator in which the thickness of the piezoelectric film is uniform and also the piezoelectric characteristic is excellent.

In the substrate carrying in step (S1), the first substrate transporting step (S3) and the second substrate transporting step (S7) of this embodiment, the internal pressure of the film forming chamber 10 is maintained lower than the internal pressure of the measuring chamber 20 at all times, and thus the flow of atmospheric air in the film forming apparatus 1 directs from the side of the measuring chamber 20 to the side of the film forming chamber 10. That is, the measuring chamber 20 is arranged at the upstream side of the film forming chamber 10 at all times.

Second Embodiment

A second embodiment according to the present invention will be hereinafter described with reference to FIGS. 8 to 13. The main difference in this embodiment from the first embodiment resides in that partition valves 61 are provided at two locations on a side of the film forming chamber and on a side of the measuring chamber in an intermediate chamber 60. The same constituent elements as the first embodiment are represented by the same numeral references, and the description thereof is omitted.

Figure 8:
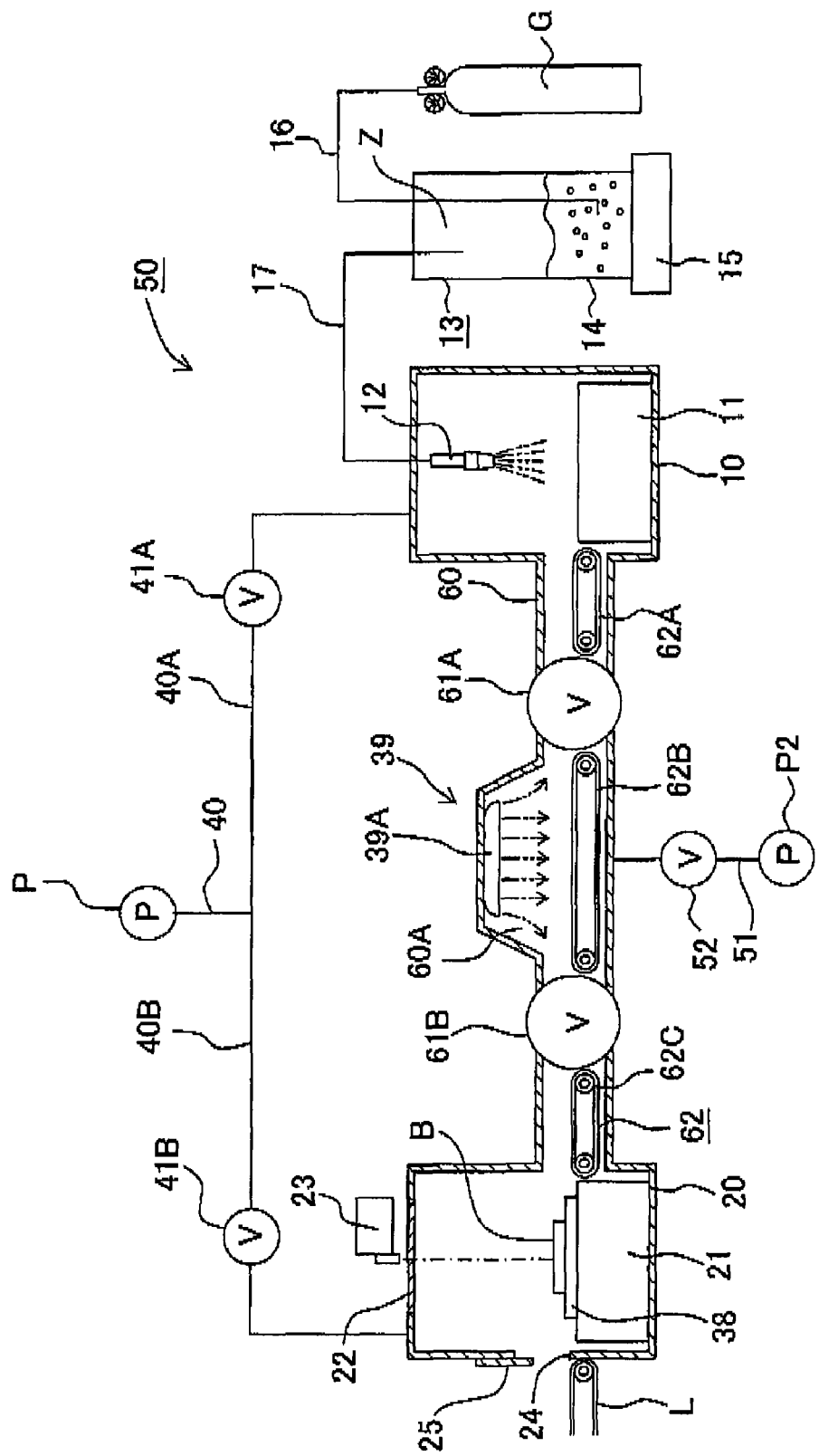
FIG. 8 is a schematic diagram showing a film forming apparatus according to the second embodiment.
Figure 9:
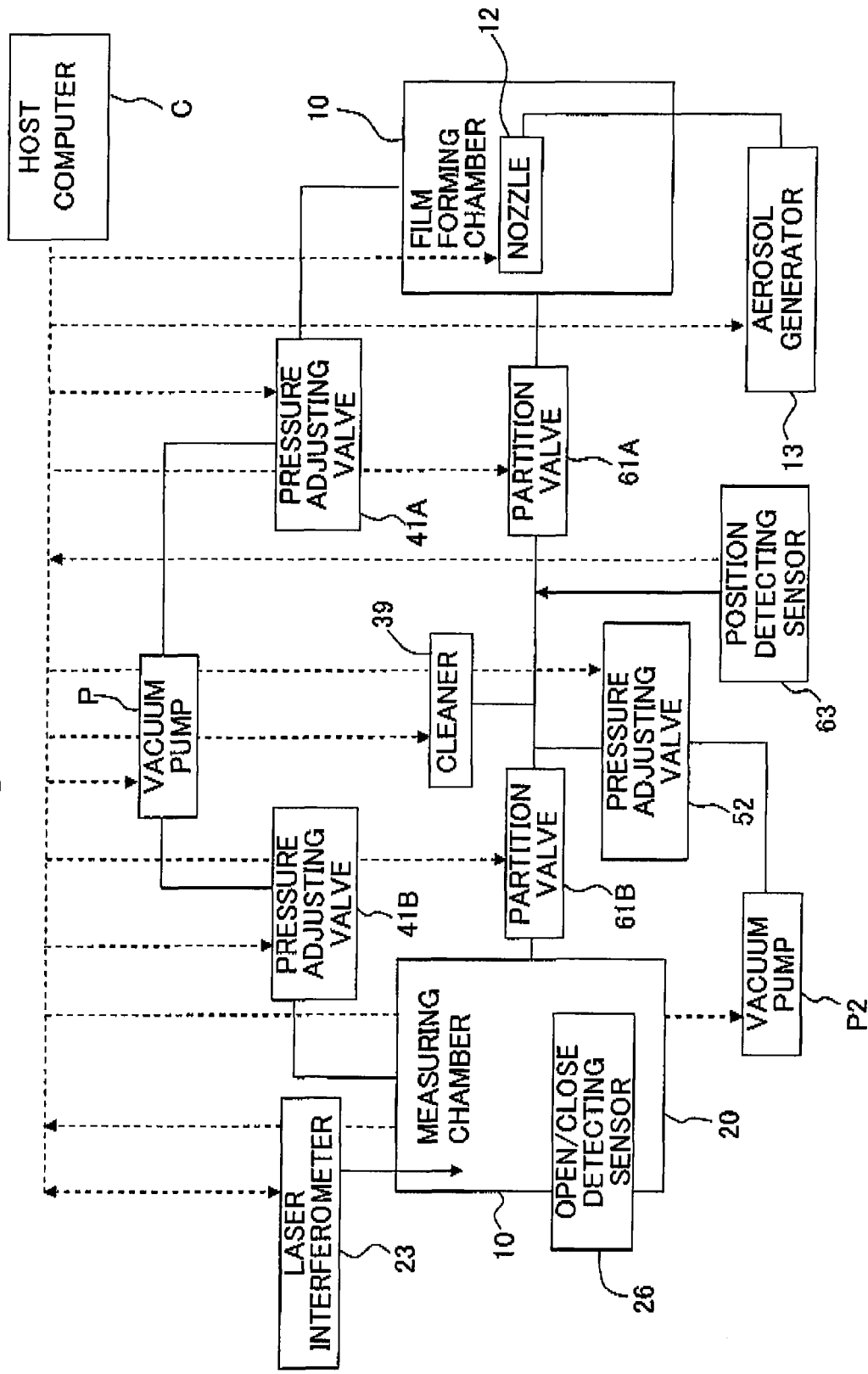
FIG. 9 is a block diagram showing the construction of the film forming apparatus according to the second embodiment.

FIG. 8 is a schematic diagram showing the overall construction of the film forming apparatus 50, and FIG. 9 is a block diagram showing the film forming apparatus 50. The film forming apparatus 50 is provided with a film forming chamber 10 for forming a film, a measuring chamber 20 for measuring the thickness of the formed film, and a host computer C for automatically controlling the operation of the film forming apparatus 50, same as the first embodiment.

A slender intermediate chamber 60 having a square piped shape, through which both the film forming chamber 10 and the measuring chamber 20 are connected to each other, is provided between the film forming chamber 10 and the measuring chamber 20. Partition valves 61A and 61B are provided at two locations on a side of the film forming chamber and on a side of the measuring chamber in the intermediate chamber 60. In the intermediate chamber 60, the space defined between the two partition valves 61A and 61B is set as a cleaning chamber 60A for cleaning dust on the substrate B, and a cleaner 39 having the same construction as the first embodiment is provided in the cleaning chamber 60A. By opening/closing the two partition valves 61A and 61B, the communication between the film forming chamber 10 and the cleaning chamber 60A and the communication between the cleaning chamber 60A and the measuring chamber 20 can be allowed or blocked.

Furthermore, as in the case of the first embodiment, a belt conveyor 62 is provided between the stage 11 arranged in the film forming chamber 10 and the measuring table 21 arranged in the measuring chamber 20 so that the substrate B is passed through the intermediate chamber 60 and transported between the stage 11 and the measuring table 21.

The belt conveyor 62 is divided into three conveyors of a conveyor 62A on a side of the film forming chamber, a conveyor 62B on a side of the intermediate chamber, and a conveyor 62C on a side of the measuring chamber with the two partition valves 61A and 61B as boundaries. When the partition valves 61A and 61B are closed, the valve plates (not shown) of the partition valves 61A and 61B enter into the gap between the conveyor 62A on the side of the film forming chamber and the conveyor 62B on the side of the intermediate chamber and the gap between the conveyor 62B on the side of the intermediate chamber and the conveyor 62C on the side of the measuring chamber. Accordingly, as in the case of the first embodiment, when the partition valves 61A and 61B are closed, the partition valves 61A and 61B do not interfere with belt conveyor 62, thereby ensuring the blocking the chambers. Furthermore, a delivery mechanism 34 having the same construction as the first embodiment is provided between the conveyor 62A on the side of the film forming chamber and the conveyor 62B on the side of the intermediate chamber and between the conveyor 62B on the side of the intermediate chamber and the conveyor 62C on the side of the measuring chamber, and the delivery mechanism 34 enables the substrate B mounted on the work table 38 to be delivered among the conveyors 62A, 62B and 62C.

Furthermore, the intermediate chamber 60 is provided with a position detecting sensor 63 (position detector) for detecting the position of the substrate B on the belt conveyor 62. A position information of the substrate B obtained by the position detecting sensor 63 is transmitted to the host computer C, and an opening/closing instruction of the partition valves 61A and 61B is output from the host computer C on the basis of the position information.

The cleaning chamber 60A is connected to a vacuum pump P2 (intermediate chamber pressure adjusting mechanism) via an exhaust pipe 51. A pressure adjusting valve 52 is provided in the exhaust pipe 51 to adjust the internal pressure of the cleaning chamber 60A.

Next, the procedure of forming a film by the film forming apparatus 50 constructed as described above will be described with reference to a flowchart of FIG. 7 and FIGS. 10 to 13. The operation of the film forming apparatus 50 described below is automatically controlled by a program stored in the host computer C as in the case of the first embodiment.

Figure 10A:
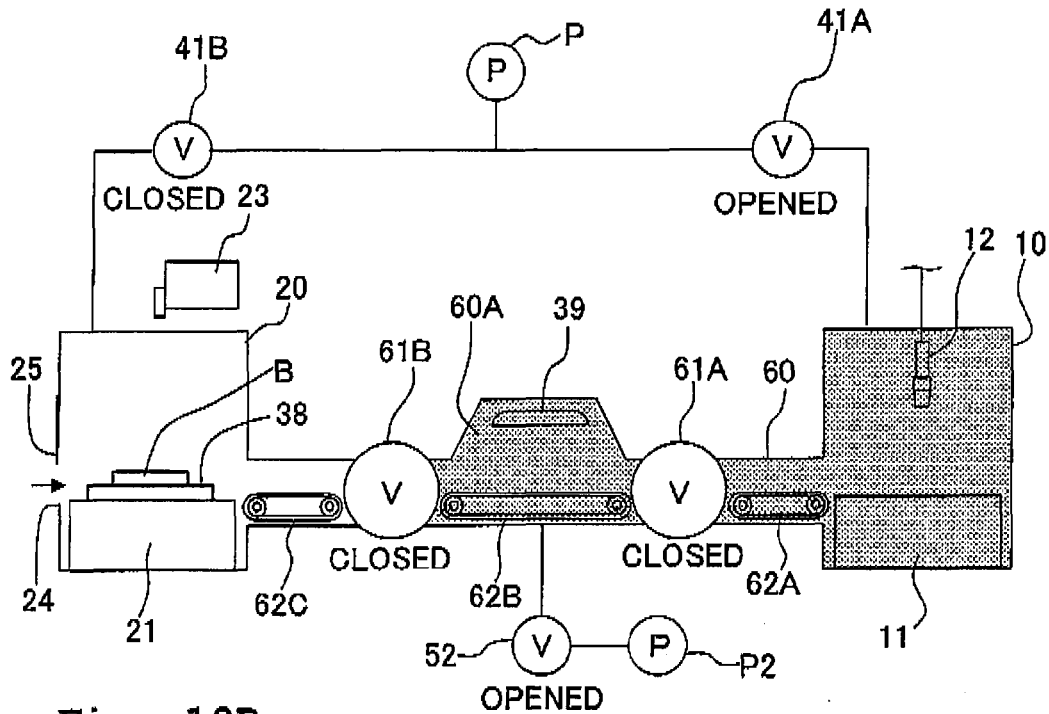
FIG. 10A is a diagram showing an aspect that the substrate is carried in the film forming apparatus in the film forming step of the second embodiment.

First, as shown in FIG. 10A, in the state that the pressure adjusting valve 41 on the side of the film forming chamber is opened and the pressure adjusting valve 41B on the side of the measuring chamber and the partition valve 61B on the side of the measuring chamber are closed, the vacuum pump P is started to reduce the internal pressure of the film forming chamber 10 so that the inside of the film forming chamber 10 is set to a substantially vacuum state. At the same time, the pressure adjusting valve 52 on the side of the intermediate chamber is opened, and the vacuum pump P2 is started to reduce the internal pressure of the cleaning chamber 60A so that the inside of the cleaning chamber 60A is set to a substantially vacuum state.

Subsequently, the port 24 is opened, and the substrate B is carried in the measuring chamber 20. After the substrate B is carried in, the port 24 is closed by the door portion 25. Then, the pressure adjusting valve 41B on the side of the measuring chamber is opened, and the internal pressure of the measuring chamber 20 is reduced so that the inside of the measuring chamber 20 is set to a substantially vacuum state.

Figure 10B:
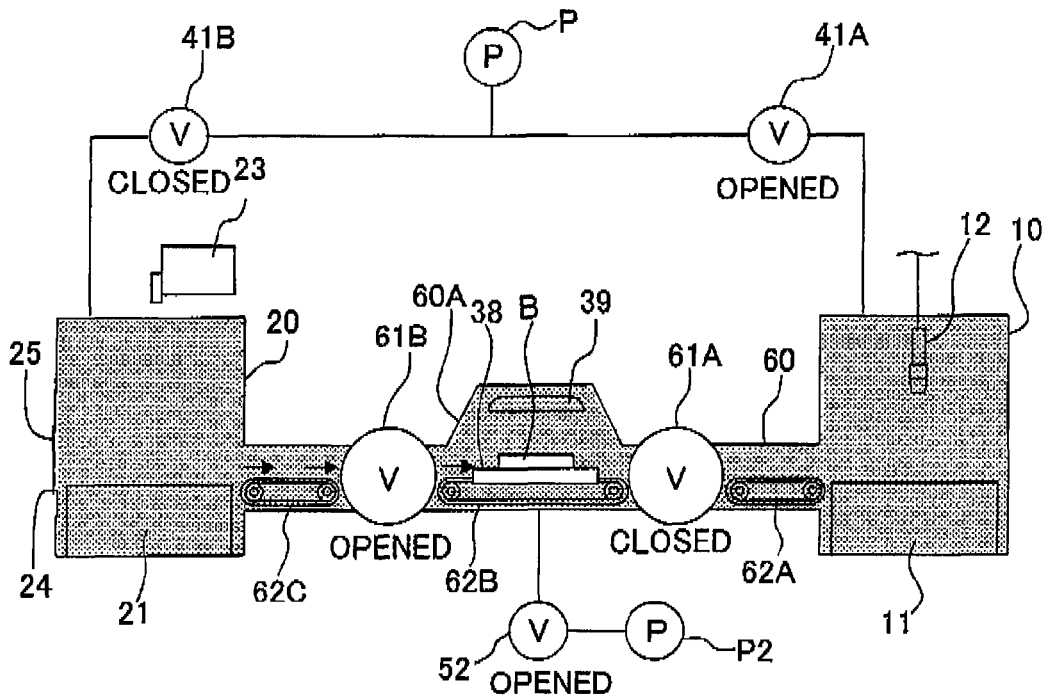
FIG. 10B is a diagram showing an aspect that the substrate is transported from the measuring chamber to an intermediate chamber in the film forming step of the second embodiment.
Figure 11A:
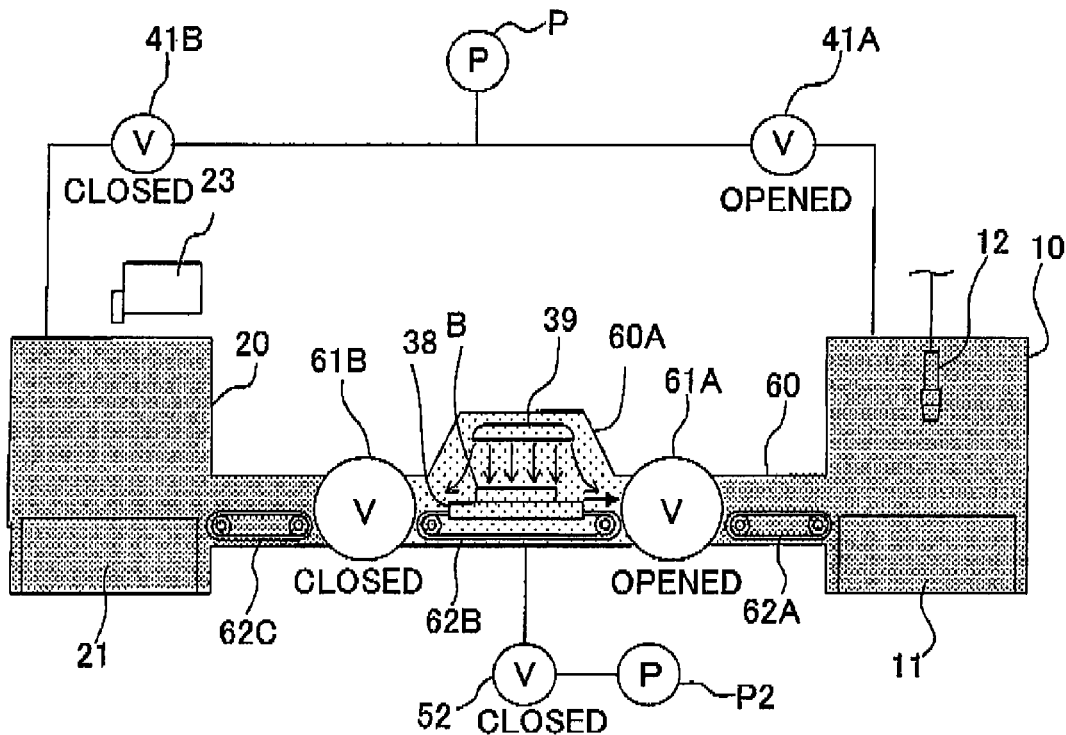
FIG. 11A is a diagram showing an aspect that the substrate is transported from the intermediate chamber to the film forming chamber in the film forming step of the second embodiment.

Subsequently, as shown in FIGS. 10B and 11A, the belt conveyor 62 is driven to transport the substrate B from the measuring chamber 20 to the film forming chamber 10 (substrate carrying in step S1). When the belt conveyor 62 is driven, the position detecting sensor 63 first detects that the substrate B is being transported from the measuring chamber 20 to the cleaning chamber 60A of the intermediate chamber 60, and transmits this information to the host computer C. On the basis of this information, the host computer C opens the partition valve 61B at the side of the measuring chamber. Then, the substrate B is delivered between the conveyor 62C on the side of the measuring chamber and the conveyor 62B on the side of the intermediate chamber, and carried in the cleaning chamber 60A (FIG. 10B). At the same time, the partition valve 61A at the side of the film forming chamber is controlled to be closed at all times while the partition valve 61B at the side of the measuring chamber is opened, whereby the film forming chamber 10 is kept depressurized.

Subsequently, the position detection sensor 63 detects that the substrate B is being transported from the cleaning chamber 60A to the film forming chamber 10, and transmits this information to the host computer c. On the basis of this information, the host computer C switches on the cleaner 39 to supply purge gas into the cleaning chamber 60A. In this state, the partition valve 61A on the side of the film forming chamber is opened. Then, the substrate B is delivered between the conveyor 62B on the side of the intermediate chamber and the conveyor 62A on the side of the film forming chamber and carried in the film forming chamber 10 (FIG. 11A). At the same time, the partition valve 61B on the side of the measuring chamber is controlled to be closed at all times while the partition valve 61A on the side of the film forming chamber is opened.

At this time, at the side of the film forming chamber 10, the pressure adjusting valve 41A is opened, and the gas supplied from the cleaner 39 is exhausted by the vacuum pump P. However, at the side of the cleaning chamber 60A of the intermediate chamber 60, the pressure adjusting valve 52 is not opened, and thus no exhaust is carried out. Accordingly, the internal pressure of the cleaning chamber 60A is higher than the internal pressure of the film forming chamber 10, and thus the flow of atmospheric air in the film forming apparatus 1 directs from the side of the cleaning chamber 60A to the side of the film forming chamber 10. With this construction, the aerosol and the material particles M in the film forming chamber 10 can be prevented from flowing into the cleaning chamber 60A and thus flowing into the side of the measuring chamber 20. That is, the inside of the measuring chamber 20 can be maintained clean, and the measuring precision can be maintained.

When transporting of the substrate B is finished, the partition valve 61A on the side of the film forming chamber is closed, and the cleaner 39 is switched off. Furthermore, the internal pressure of the cleaning chamber 60A is increased when the substrate B is transported, and thus the internal pressure of the cleaning chamber 60A is adjusted to be substantially equal to the internal pressure of the film forming chamber 10 and the measuring chamber 20 by opening the pressure adjusting valve 52 on the side of the intermediate chamber. After the adjustment, the pressure adjusting valve 52 is closed.

Figure 11B:
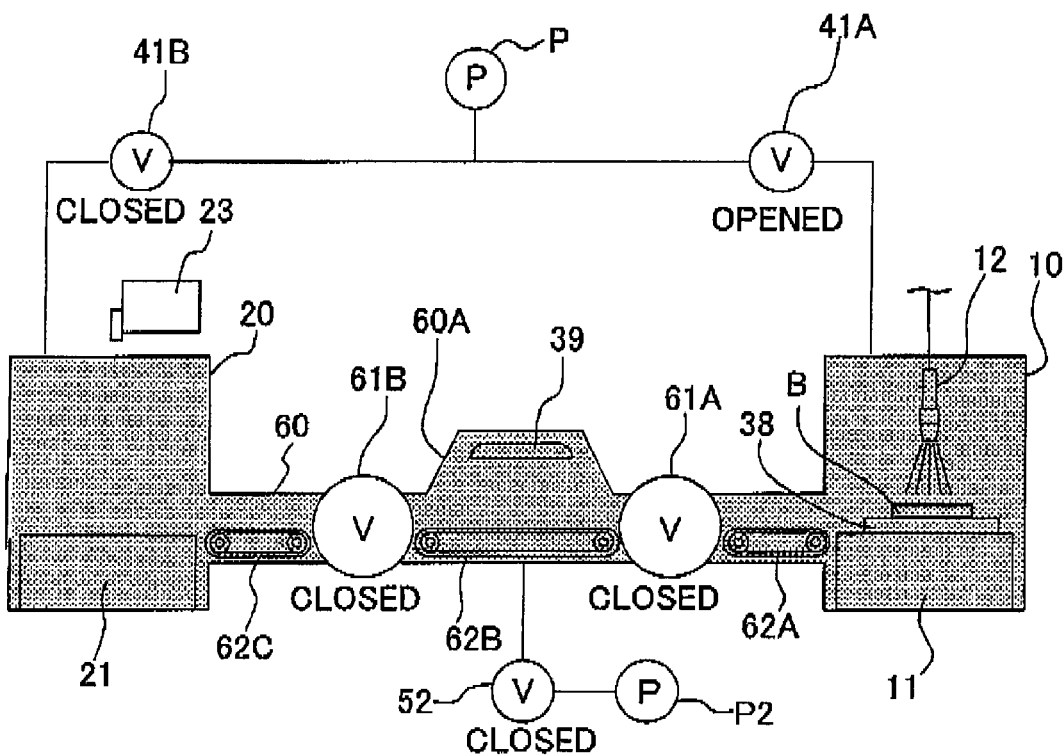
FIG. 11B is a diagram showing an aspect that the film is formed in the film forming chamber in the film forming step of the second embodiment.

Subsequently, as shown in FIG. 11B, a film formation is carried out (the film forming step or the piezoelectric film forming step S2). The procedure of the film formation is same as the first embodiment, and thus the description thereof is omitted.

Figure 12A:
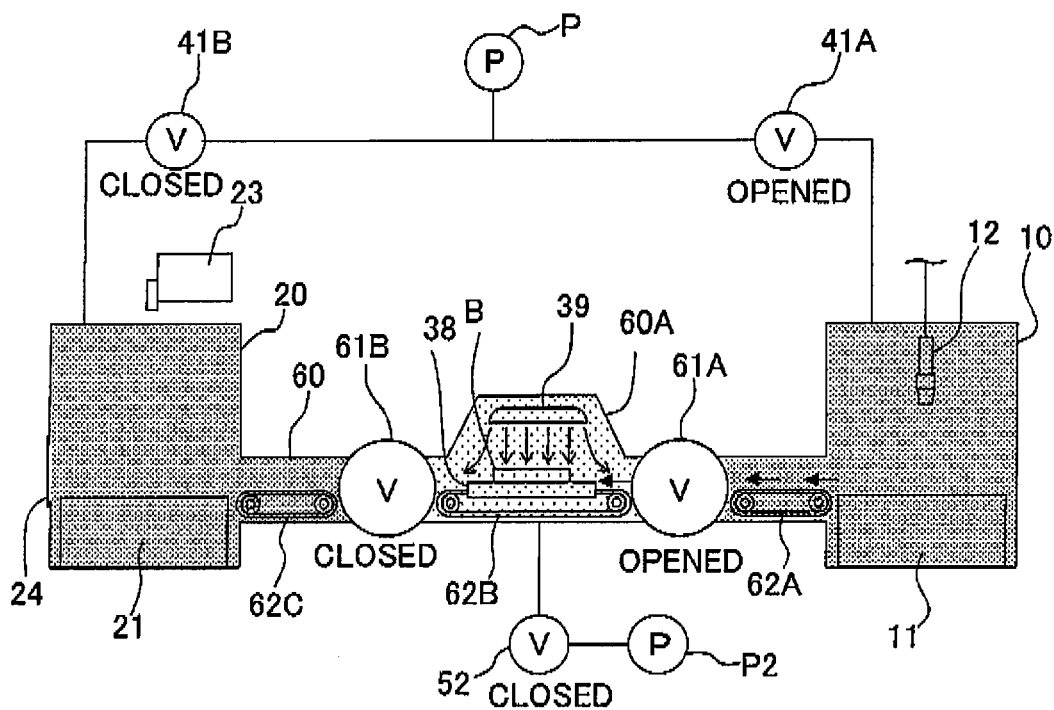
FIG. 12A is a diagram showing an aspect that the substrate is transported from the film forming chamber to the intermediate chamber in the film forming step of the second embodiment.
Figure 12B:
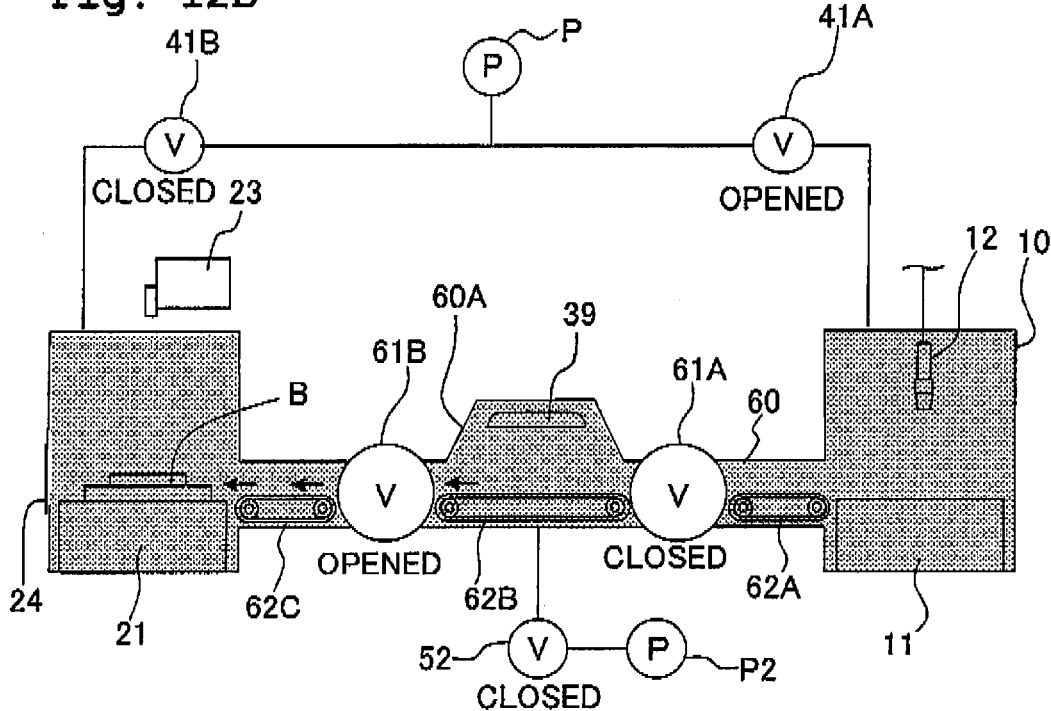
FIG. 12B is a diagram showing an aspect that the substrate is transported from the intermediate chamber to the measuring chamber in the film forming step of the second embodiment.

After the film formation, the substrate B is transported from the film forming chamber 10 to the measuring chamber 20 as shown in FIGS. 12A and 12B (first substrate transporting step S3). When the belt conveyor 62 is driven, the position detecting sensor 63 detects that the substrate B is being transported from the film forming chamber 10 to the cleaning chamber 60A of the intermediate chamber 60, and transmits this information to the host computer C. On the basis of this information, the host computer C switches on the cleaner 39 to supply purge gas to the intermediate chamber 30. In addition, the partition valve 61A on the side of the film forming chamber is opened. The substrate B is delivered between the conveyor 62A on the side of the film forming chamber and the conveyor 62B on the side of the intermediate chamber, and then transported to the cleaning chamber 60A (FIG. 12A). At the same time, the partition valve 61B on the side of the measuring chamber side is controlled to be closed at all times while the partition valve 61A on the side of the film forming chamber is opened, so that the film forming chamber 10 is kept depressurized.

At this time, as in the case of the above-described substrate carrying in step S1, at the side of the film forming chamber 10, the pressure adjusting valve 41A is opened, and gas supplied from the cleaner 39 is exhausted by the vacuum pump P. However, at the side of the cleaning chamber 60A of the intermediate chamber 60, the pressure adjusting valve 52 is not opened, and thus no exhaust is carried out. Accordingly, the internal pressure of the cleaning chamber 60A is higher than the internal pressure of the film forming chamber 10, and the flow of atmospheric air in the film forming apparatus 1 directs from the side of the cleaning chamber 60A to the side of the film forming chamber 10 at all times. With this construction, the aerosol and the material particles M in the film forming device 10 can be prevented from flowing into the cleaning chamber 60A, and thus prevented from flowing into the side of the measuring chamber 20.

In the cleaning chamber 60A, purge gas is sprayed onto the substrate B by the cleaner 39 to clean the substrate B while the substrate B passes over the lower side of the cleaner 39. Accordingly, the excess material particles M are prevented from adhering to the substrate B and being transported to the measuring chamber 20 and polluting the inside of the measuring chamber 20. When the cleaning of the substrate B is finished, the cleaner 39 is stopped.

Subsequently, the internal pressure of the cleaning chamber 60A is increased owing to the supply of purge gas from the cleaner 39, and thus by opening the pressure adjusting valve 52 on the side of the intermediate chamber, the internal pressure of the cleaning chamber 60A is depressurized so as to be substantially equal to the internal pressure in the film forming chamber 10 and the measuring chamber 20. After the pressure is reduced, the pressure adjusting valve 52B is closed.

Subsequently, the substrate B is transported from the cleaning chamber 60A to the measuring chamber 20. When the belt conveyor 62 is driven, the position detecting sensor 63 detects that the substrate B is being transported from the cleaning chamber 60A to the measuring chamber 20, and transmits this information to the host computer C. On the basis of this information, the host computer C opens the partition valve 61B on the side of the measuring chamber. The substrate B is delivered between the conveyor 62B on the side of the intermediate chamber and the conveyor 62C on the side of the measuring chamber and transported into the measuring chamber 20. At the same time, the partition valve 61A on the side of the film forming chamber is controlled to be closed at all times while the partition valve 61B on the side of the measuring chamber is opened. Accordingly, the aerosol Z and the material particles M in the film forming chamber 10 are prevented from flowing into the measuring chamber 20 and polluting the inside of the measuring chamber 20, thereby inside of the measuring chamber 20 is kept clean. Accordingly, the measuring precision can be maintained. After transporting of the substrate B is finished, the partition valve 31B on the side of the measuring chamber is closed.

Figure 13:
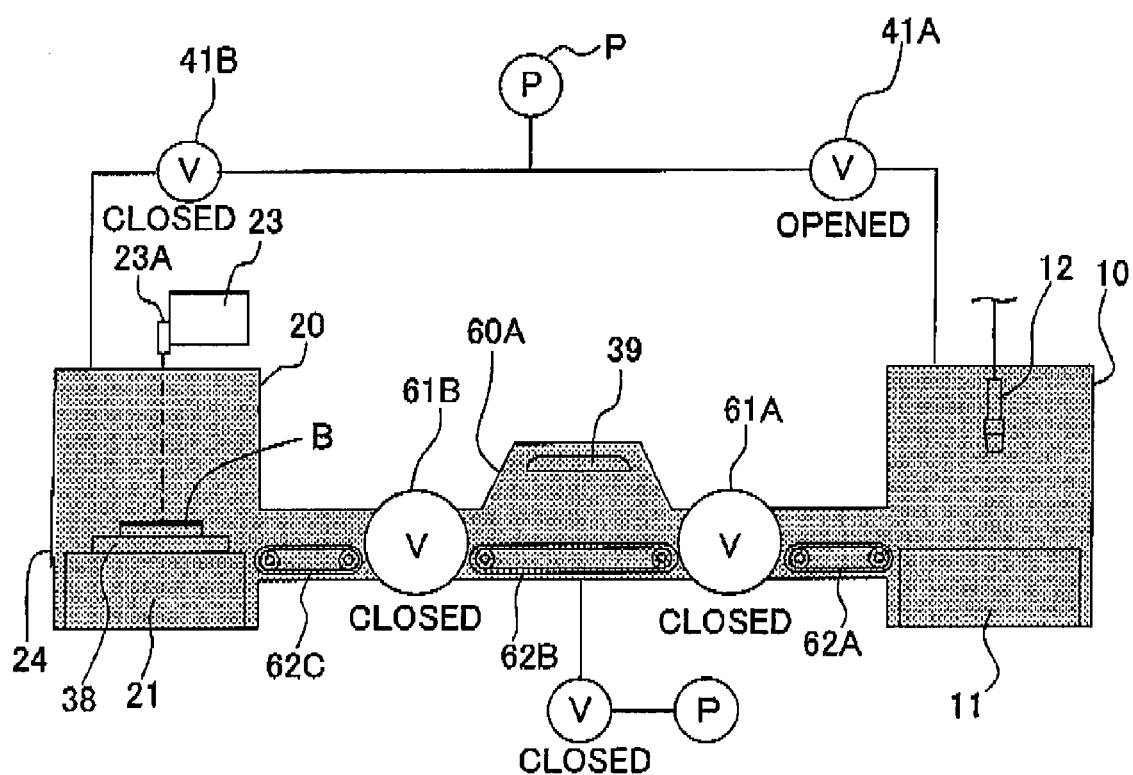
FIG. 13 is a diagram showing an aspect that thickness of the film is measured in the measuring chamber in the film forming step of the second embodiment.

Subsequently, thickness distribution of the film formed in the film forming step is measured (film thickness measuring step S4) as shown in FIG. 13. The measuring procedure is same as the first embodiment, and thus the description thereof is omitted.

When the measurement is finished, the host computer C judges on the basis of the transmitted data whether film having a predetermined reference thickness is formed or not (judging step S5). If it is judged that the film has the reference thickness or if it is judged that the film has a thickness larger than the reference thickness, the film formation is finished, and in the state that the partition valve 61B is closed, the port 24 is opened and the substrate B is carried out the measuring chamber 20 (substrate carrying out step S6). The details of the substrate carrying out step S6 are same as the first embodiment, and the description is omitted.

On the other hand, if it is judged that the film thickness is less than the reference thickness, the substrate B is transported to the film forming chamber 10 again (second substrate transporting step S7). That is, as in the case of the carrying in operation of the substrate B, the partition valve 61B on the side of the measuring chamber is first opened, and the substrate B is transported from the measuring chamber 20 to the cleaning chamber 60A in the state that the partition valve 61A on the side of the film forming chamber is closed (FIG. 10B). Subsequently, the partition valve 61A on the side of the film forming chamber is opened while purge gas is supplied from the cleaner 39, and the substrate B is transported from the cleaning chamber 60A to the film forming chamber 10 in the state that the partition valve 61B on the side of the measuring chamber is closed (FIG. 11A). At this time, as in the case of the first substrate transporting step, the internal pressure of the cleaning chamber 60A is set to be higher than the internal pressure of the film forming chamber 10 by the purge gas supplied from the cleaner 39, whereby the aerosol and the material particles M in the film forming chamber 10 are prevented from flowing into the cleaning chamber 60A.

When the substrate B is set onto the stage, the host computer C adjusts the film forming condition according to the analysis result in the previous film thickness measuring step (adjusting step S8) as in the case of the first embodiment. Thereafter, the film forming step S2 is executed again (FIG. 11B).

When the film formation is finished, the substrate B is transported to the measuring chamber 20 again (FIG. 12A, FIG. 12B), thickness of the film is measured (FIG. 13). As described above, the substrate B is reciprocated between the film forming chamber 10 and the measuring chamber 20 to repeat the film formation and the measurement until thickness of the film reaches a desired thickness. When the film formation is completed, as in the case of the first embodiment, the port 24 is opened and the substrate B is carried out the measuring chamber 20 in a state that the partition valves 61A and 61B are closed.

As described above, according to this embodiment, the same action and effect as the first embodiment can be achieved. In addition, the partition valves 61 are provided at the two locations on the side of the film forming chamber and on the side of the measuring chamber. When one of the two partition valves 61A and 61B is opened, the other valve is set to be closed. Accordingly, even when the inside of the film forming chamber 10 is remarkably polluted because the remaining aerosol Z floats in the film forming chamber 10 or the material particles M adhere to the inner wall portion, or the like, these materials can be prevented from flowing into the measuring chamber 20 and thus polluting inside of the measuring chamber 20. Accordingly, the measuring precision in the measuring chamber 20 can be maintained.

Furthermore, by using the film forming apparatus 1 of this embodiment, there can easily be manufactured a piezoelectric actuator in which thickness of the piezoelectric film is uniform and the piezoelectric characteristic is excellent. For example, the particles of the piezoelectric material are used as the material particles M, the substrate B is formed of metal so as to be usable as one electrode, and piezoelectric film is formed of the particles of the piezoelectric material on the metal substrate B. By forming the other electrode on the piezoelectric film according to the screen printing or the like, the piezoelectric element can be allowed to function. That is, it can be used as a piezoelectric actuator.

The scope of the present invention is not limited by the above-described embodiments, and for example, the following descriptions are contained in the scope of the present invention. The scope of the present invention expands to an equivalent scope.

In the substrate carrying in step (S1), the first substrate transporting step (S3) and the second substrate transporting step (S7) of the first embodiment, at the side of the film forming chamber 10, the pressure adjusting valve 41A is opened, and the gas supplied from the cleaner 39 is exhausted by the vacuum pump P. On the other hand, at the side of the measuring chamber 20, the pressure adjusting valve 41B is not opened, and thus no exhaust is carried out. Accordingly, the internal pressure of the measuring chamber 20 is higher than the internal pressure of the film forming chamber 10, and also the flow of atmospheric air in the film forming apparatus 1 directs from the side of the measuring chamber 20 to the side of the film forming chamber 10. That is, the measuring chamber 20 is arranged at the upstream of the film forming chamber 10 at all times relative to the vacuum pump P.

In the substrate carrying in step (S1), the first substrate transporting step (S3) and the second substrate transporting step (S7) of the second embodiment, at the side of the film forming chamber 10, the pressure adjusting valve 41A is opened, and the gas supplied from the cleaner 39 is exhausted by the vacuum pump P. On the other hand, at the side of the cleaning chamber 60A, the pressure adjusting valve 52 is not opened, and thus no exhaust is carried out. Accordingly, the internal pressure of the cleaning chamber 60A is higher than the internal pressure of the film forming chamber 10, and also the flow of atmospheric air in the film forming apparatus 1 directs from the side of the cleaning chamber 60A to the side of the film forming chamber 10 at all times. That is, the cleaning chamber 60A is arranged at the upstream of the film forming chamber 10 at all times relative to the vacuum pump P, and further the measuring chamber 20 is arranged at the further upstream of the cleaning chamber 60A.

In the first embodiment, the cleaner 39 also serves as the second pressure adjusting mechanism. However, the second pressure adjusting mechanism may be provided separately from the cleaner 39. For example, by connecting gas supply means such as a gas cylinder or the like to the measuring chamber 20 to supply gas only to the measuring chamber 20, the difference in internal pressure between the film forming chamber 10 and the measuring chamber 20 may be adjusted. Furthermore, the difference in internal pressure between the film forming chamber 10 and the measuring chamber 20 may be adjusted by setting a difference in the aperture between the two pressure adjusting valves 41A and 41B. Still furthermore, as in the case of the second embodiment, gas supply means may be separately provided in the cleaning chamber 60A, and the difference in internal pressure between the film forming chamber 10 or the measuring chamber 20 and the cleaning chamber 60A may be adjusted on the basis of the difference in the aperture among the pressure adjusting valves 41A, 41B and 52.

In the second embodiment, the partition valves 61A and 61B are opened and the substrate B is transported between the film forming chamber 10 or the measuring chamber 20 and the cleaning chamber 60A while the purge gas is supplied from the cleaner 39. However, when the cleaner 39 does not serve as the second pressure adjusting mechanism as described in the above description (1), the cleaner 39 is actuated and a cleaning work is carried out on the substrate B in the state that the partition valves 61A and 61B at the two locations are closed. After the cleaning is finished, the cleaner 39 is stopped, and the internal pressure of the cleaning chamber 60A is adjusted so as to be equal to the internal pressure of the film forming chamber 10 and the measuring chamber 20. Thereafter, the partition valves 61A and 61B are opened, and the substrate B is transported. Through this operation, the variation of the internal pressure of the intermediate chamber during the removing work, the material particles removed from the substrate, or the like, can be prevented from affecting the film formation and the measurement.

In the second embodiment, in the state that all the film forming chamber 10, the cleaning chamber 60A and the measuring chamber 20 are depressurized, the partition valves 61A and 61B are opened, and the substrate B is transported between the film forming chamber 10 or the measuring chamber 20 and the cleaning chamber 60A. However, by controlling the two partition valves 61A and 61B, the pressure adjusting valve 52 on the side of the intermediate chamber, the vacuum pump 50, or the like, for example, the internal pressure of the measuring chamber 20 is set to normal pressure at all times, the internal pressure of the cleaning chamber 60A is set to normal pressure when the substrate B is transported between the measuring chamber 20 and the cleaning chamber 60A, and the internal pressure of the cleaning chamber 60A is depressurized when the substrate B is transported between the film forming chamber 10 and the cleaning chamber 60A. Through this operation, the substrate can be transported by merely changing the internal pressure of the intermediate chamber which needs only a relatively narrower space as compared with the film forming chamber and the measuring chamber and whose internal pressure can easily be adjusted.

In the above embodiments, one vacuum pump P is connected to both the film forming chamber 10 and the measuring chamber 20 via the pressure adjusting valves 41A and 41B. However, the two pressure adjusting mechanisms may be connected to the film forming chamber and the measuring chamber, respectively, to adjust the pressure individually.

In the above embodiments, the film forming chamber 10 and the measuring chamber 20 are connected to each other via the intermediate chambers 30 and 60. However, according to this invention, the intermediate chamber is not necessarily required. For example, the measuring chamber may be directly connected to the film forming chamber, and both chambers may be partitioned by a shielding member such as a shutter or the like.

In the above embodiments, the laser interferometer 23 is provided at outside of the measuring chamber 20, and the film is measured through the window portion 22. However, the measuring mechanism may be arranged in the measuring chamber.

In the above embodiments, the belt conveyors 32 of two lines are provided, however, one line of the conveyor may be provided.

In the above embodiments, the operation of the film forming apparatuses 1 and 50 are automatically controlled by the host computer C, however, a part or the whole of the operation of the film forming apparatus may be manually controlled by an operator or the like.

In the second embodiment, when the substrate B is transported from the cleaning chamber to the measuring chamber, no difference in pressure is particularly provided between both the chambers. However, the pressure adjustment may be performed so that the internal pressure of the measuring chamber 20 is higher than the internal pressure of the cleaning chamber 60A. With this operation, even when the aerosol Z flows from the film forming chamber into the cleaning chamber 60A or the material particles M, or the like, removed from the substrate B by cleaning are floating in the cleaning chamber 60A, these material particles can be prevented from flowing into the measuring chamber 20 and thus polluting inside of the measuring chamber 20.

In the above embodiments, the adjusting step S8 is executed after the second substrate transporting step S7. However, the adjusting step S8 may be executed at any time insofar as it is subsequent to the judging step S5. For example, it may be executed parallel to the second substrate transporting step S7.

In the above embodiments in the substrate carrying in step S1, the substrate B carried in from the port 24 of the measuring chamber 20 is transported to the film forming chamber 10 via the belt conveyor 32, however, the present invention is not limited to this mode. For example, the film forming chamber 10 may be provided with a carrying in port of the substrate B and a door for opening/closing the port so that the substrate B is directly carried in from outside.

What is claimed is:

1. A film forming apparatus comprising:
    a film forming chamber which forms a film;
    a jetting mechanism which jets aerosol containing material particles onto a substrate in the film forming chamber to form a film formed of the material particles on the substrate; a measuring chamber communicating with the film forming chamber;
    a measuring mechanism which measures a thickness of the film in the measuring chamber;

a pressure adjusting mechanism which is connected to the film forming chamber and the measuring chamber via a first valve and a second valve, respectively, and which controls an internal pressure of the film forming chamber and an internal pressure of the measuring chamber;

a conveyor which transports the substrate between the film forming chamber and the measuring chamber;

a blocking section which blocks a communication between the film forming chamber and the measuring chamber;

a pressure controller which controls the pressure adjusting mechanism and the valves; and a blocking controller which controls the blocking section, wherein, when the substrate is transported by the conveyor, the blocking controller controls the blocking section to communicate the film forming chamber and the measuring chamber, and the pressure controller closes the second valve between the pressure adjusting mechanism and the measuring chamber, opens the first valve between the pressure adjusting mechanism and the film forming chamber, and controls the pressure adjusting mechanism to make the internal pressure of the measuring chamber greater than the internal pressure of the film forming chamber.

2. The film forming apparatus according to claim 1, wherein the measuring mechanism is a non-contact type mechanism, and arranged at outside of the measuring chamber.

3. The film forming apparatus according to claim 2, wherein the measuring mechanism is an optical mechanism which is provided with a light emitting section which emits light to the substrate, and a light receiving section which receives light reflected from the substrate.

4. The film forming apparatus according to claim 1, wherein a port for carrying the substrate in and out is provided in the measuring chamber.

5. The film forming apparatus according to claim 1, wherein the conveyor is provided as a plurality of conveyors.

6. The film forming apparatus according to claim 1, further comprising an intermediate chamber, provided between the film forming chamber and the measuring chamber, through which the film forming chamber and the measuring chamber communicate with each other, wherein the intermediate chamber is provided with a cleaner which removes contamination of the substrate.

7. The film forming apparatus according to claim 6, wherein the cleaner is a gas cleaner which removes the contamination of the substrate by spraying gas to the substrate, and the gas cleaner serves also as a second pressure adjusting mechanism which adjusts a pressure of one of the film forming chamber and the measuring chamber communicating with the intermediate chamber by supplying gas to the intermediate chamber.

8. The film forming apparatus according to claim 7, wherein the gas is same as gas which forms the aerosol.

9. The film forming apparatus according to claim 6, wherein the blocking section is formed as a plurality of blocking sections provided in the intermediate chamber at two locations on a side of the film forming chamber and a side of the measuring chamber.

10. The film forming apparatus according to claim 9, wherein the cleaner is arranged in the intermediate chamber between the blocking sections at the two locations.

11. The film forming apparatus according to claim 9, wherein an intermediate chamber-pressure adjusting mechanism, which controls an internal pressure of a space partitioned by the blocking sections at the two locations, is arranged in the intermediate chamber.

12. The film forming apparatus according to claim 4, further comprising an opening/closing portion which is provided in the measuring chamber and which opens/closes the port, and an open/close detector which detects an open/close state of the port by the opening/closing portion, wherein the blocking controller closes the blocking section when the open/close detector detects that the port is in an open state.

13. The film forming apparatus according to claim 9, further comprising a position detector which is provided in the conveyor and which detects a position of the substrate on the conveyor; and a blocking controller which closes the blocking section on the side of the measuring chamber and opens the blocking section on the side of the film forming chamber when the position detector detects that the substrate is located between the film forming chamber and the intermediate chamber, and which closes the blocking section on the side of the film forming chamber and opens the blocking section on the side of the measuring chamber when the position detector detects that the substrate is located between the measuring chamber and the intermediate chamber.

14. The film forming apparatus according to claim 1, further comprising a judging section which judges whether or not the thickness of the film measured by the measuring mechanism is smaller than a predetermined reference thickness; a jet condition adjusting section which adjusts a jet condition of the jetting mechanism on the basis of the thickness of the film measured by the measuring mechanism; and an apparatus controller which controls, the conveyor to transport the substrate from the measuring chamber to the film forming chamber, which controls the jet condition adjusting section to adjust the jet condition of the jetting mechanism in accordance with the thickness of the film and controls the jetting mechanism to jet the aerosol to the substrate transported to the film forming chamber according to the adjusted jet condition when the judging section judges that the film thickness is smaller than the reference thickness.

* * * * *